US012609670B2

(12) United States Patent
Caron et al.

(10) Patent No.: US 12,609,670 B2
(45) Date of Patent: Apr. 21, 2026

(54) ACOUSTIC WAVE DEVICES WITH THERMAL BYPASS

(71) Applicant: Skyworks Solutions, Inc., Irvine, CA (US)

(72) Inventors: Joshua James Caron, Summerfield, NC (US); Benjamin Paul Abbott, Irvine, CA (US); Eesa Rahimi, Greensboro, NC (US)

(73) Assignee: Skyworks Solutions, Inc., Irvine, CA (US)

( * ) Notice: Subject to any disclaimer, the term of this patent is extended or adjusted under 35 U.S.C. 154(b) by 827 days.

(21) Appl. No.: 17/813,711

(22) Filed: Jul. 20, 2022

(65) Prior Publication Data

US 2023/0027129 A1 Jan. 26, 2023

Related U.S. Application Data

(60) Provisional application No. 63/223,916, filed on Jul. 20, 2021.

(51) Int. Cl.
| | |
|---|---|
| *H03H 9/02* | (2006.01) |
| *H03H 9/17* | (2006.01) |
| *H03H 9/64* | (2006.01) |
| *H03H 9/72* | (2006.01) |
| *H10N 30/87* | (2023.01) |

(52) U.S. Cl.
CPC .... *H03H 9/02834* (2013.01); *H03H 9/02102* (2013.01); *H03H 9/02574* (2013.01); *H03H 9/171* (2013.01); *H03H 9/6406* (2013.01);

*H10N 30/87* (2023.02); *H10N 30/872* (2023.02); *H03H 9/725* (2013.01)

(58) Field of Classification Search
CPC ........... H03H 9/02834; H03H 9/02102; H03H 9/171; H03H 9/02574; H10N 30/872
See application file for complete search history.

(56) References Cited

U.S. PATENT DOCUMENTS

| | | | | |
|---|---|---|---|---|
| 3,904,996 A | * | 9/1975 | Rosenfeld | H03H 3/08 333/196 |
| 4,035,675 A | * | 7/1977 | Malocha | H03H 9/14523 333/196 |
| 4,344,049 A | * | 8/1982 | Grobe | G10K 11/36 333/154 |
| 5,521,565 A | * | 5/1996 | Anemogiannis | H03H 9/6489 333/195 |

(Continued)

*Primary Examiner* — Pedro J Cuevas
(74) *Attorney, Agent, or Firm* — Knobbe, Martens, Olson & Bear, LLP

(57) ABSTRACT

An acoustic wave device can have a plurality of coupling portions configured to electrically couple electrodes of the device to the substrate of the device to provide a bypass current pathway through the substrate for heat management. The substrate can be a semiconductor material, which can become more conductive as the temperature increases so that the bypass current pathway diverts more power through the substrate as the temperature increases. The acoustic wave device can be a surface acoustic wave device, which can have an interdigital transducer electrode that has the coupling portions on each of the bus bars and extending through the piezoelectric layer to contact the substrate. The acoustic wave device can be a bulk acoustic wave device in some implementations.

26 Claims, 15 Drawing Sheets

(56) References Cited

U.S. PATENT DOCUMENTS

| | | | |
|---|---|---|---|
| 5,977,686 A * | 11/1999 | Kadota | H03H 9/6433 |
| | | | 310/313 B |
| 5,982,608 A | 11/1999 | Kalnitsky et al. | |
| 6,121,860 A * | 9/2000 | Tsutsumi | H03H 9/643 |
| | | | 333/195 |
| 6,353,371 B1 * | 3/2002 | Kadota | H03H 9/6436 |
| | | | 333/195 |
| 6,577,210 B1 * | 6/2003 | Tsutsumi | H03H 9/64 |
| | | | 333/195 |
| 6,670,866 B2 | 12/2003 | Ellae et al. | |
| 6,706,548 B2 | 3/2004 | Liu | |
| 6,963,257 B2 | 11/2005 | Ellae et al. | |
| 7,053,730 B2 | 5/2006 | Park et al. | |
| 7,233,218 B2 | 6/2007 | Park et al. | |
| 7,292,122 B2 * | 11/2007 | Kanasaki | H03H 9/0057 |
| | | | 333/195 |
| 7,304,553 B2 * | 12/2007 | Bauer | H03H 9/02779 |
| | | | 333/195 |
| 7,321,279 B2 * | 1/2008 | Yoneya | H03H 9/6433 |
| | | | 333/195 |
| 7,375,454 B2 * | 5/2008 | Takasaki | G06F 3/016 |
| | | | 310/354 |
| 7,556,978 B2 | 7/2009 | Liu | |
| 7,560,853 B2 | 7/2009 | Sano et al. | |
| 7,653,118 B1 * | 1/2010 | Whelan | H04B 1/69 |
| | | | 375/139 |
| 7,841,056 B2 | 11/2010 | Matsumoto et al. | |
| 8,035,463 B2 * | 10/2011 | Tanaka | H03H 9/02228 |
| | | | 333/195 |
| 8,084,917 B2 * | 12/2011 | Yamanaka | H03H 9/14547 |
| | | | 310/313 D |
| 8,736,140 B2 * | 5/2014 | Yamanaka | H03H 9/02551 |
| | | | 310/313 D |
| 9,770,907 B2 | 9/2017 | Tsukahara et al. | |
| 10,263,602 B2 | 4/2019 | Caron et al. | |
| 10,284,177 B2 | 5/2019 | Caron et al. | |
| 10,367,475 B2 | 7/2019 | Caron | |
| 10,396,746 B2 | 8/2019 | Burgess et al. | |
| 10,432,235 B2 | 10/2019 | Thompson | |
| 10,490,728 B2 | 11/2019 | Xia et al. | |
| 10,513,429 B2 | 12/2019 | Cheng et al. | |
| 10,541,673 B2 | 1/2020 | Caron | |
| 10,541,713 B2 | 1/2020 | Ni et al. | |
| 10,886,889 B2 * | 1/2021 | Sakashita | H03H 9/02992 |
| 10,913,093 B2 | 2/2021 | Chau | |
| 10,944,041 B1 | 3/2021 | Tsai et al. | |
| 10,951,178 B2 | 3/2021 | Ripley et al. | |
| 11,038,487 B2 | 6/2021 | Caron | |
| 11,050,012 B2 | 6/2021 | Wang et al. | |
| 11,088,675 B2 | 8/2021 | Caron et al. | |
| 11,165,406 B2 | 11/2021 | Lin et al. | |
| 11,177,787 B2 | 11/2021 | Caron et al. | |
| 11,277,113 B2 | 3/2022 | Park et al. | |
| 11,305,985 B2 | 4/2022 | Sun et al. | |
| 11,309,352 B2 | 4/2022 | Goktepeli et al. | |
| 11,451,212 B2 | 9/2022 | Komatsu et al. | |
| 11,508,902 B2 | 11/2022 | Tsai et al. | |
| 11,552,614 B2 | 1/2023 | Caron et al. | |
| 11,563,418 B2 | 1/2023 | Caron | |
| 11,595,018 B2 | 2/2023 | Liu et al. | |
| 11,611,325 B2 * | 3/2023 | Suzuki | H03H 9/02921 |
| 11,611,327 B2 * | 3/2023 | Daimon | H03H 9/14547 |
| 11,646,713 B2 * | 5/2023 | Suzuki | H03H 9/64 |
| | | | 333/193 |
| 11,652,460 B2 | 5/2023 | Wang | |
| 11,689,180 B2 * | 6/2023 | Suzuki | H03H 9/02574 |
| | | | 310/313 B |
| 11,777,472 B2 | 10/2023 | Weng et al. | |
| 11,812,664 B2 | 11/2023 | Wang et al. | |
| 11,821,872 B2 * | 11/2023 | Abdolvand | H03H 9/02559 |
| 11,838,001 B2 | 12/2023 | Weng | |
| 12,011,890 B2 * | 6/2024 | Wang | B29C 70/62 |
| 12,028,040 B2 * | 7/2024 | Garcia | H03H 9/02228 |
| 12,035,104 B2 | 7/2024 | Chen | |

| | | | |
|---|---|---|---|
| 12,113,504 B2 | 10/2024 | Wang | |
| 12,184,265 B2 | 12/2024 | Kim et al. | |
| 12,375,054 B2 | 7/2025 | Shirakawa et al. | |
| 2005/0212620 A1 * | 9/2005 | Bauer | H03H 9/0042 |
| | | | 310/313 R |
| 2006/0017524 A1 * | 1/2006 | Yoneya | H03H 9/6433 |
| | | | 333/195 |
| 2007/0247019 A1 * | 10/2007 | Takasaki | G06F 3/016 |
| | | | 310/313 B |
| 2009/0231061 A1 * | 9/2009 | Tanaka | H03H 9/02551 |
| | | | 333/195 |
| 2010/0102669 A1 * | 4/2010 | Yamanaka | H03H 9/14547 |
| | | | 310/313 D |
| 2012/0105165 A1 * | 5/2012 | Yamanaka | H03H 9/1092 |
| | | | 331/158 |
| 2012/0200371 A1 | 8/2012 | Yamashita | |
| 2012/0280767 A1 | 11/2012 | Burak et al. | |
| 2014/0118091 A1 | 5/2014 | Burak et al. | |
| 2015/0280100 A1 | 10/2015 | Burak et al. | |
| 2019/0149123 A1 * | 5/2019 | Sakashita | H03H 9/173 |
| | | | 333/195 |
| 2019/0273480 A1 | 9/2019 | Lin et al. | |
| 2019/0326874 A1 | 10/2019 | Nakamura et al. | |
| 2019/0326875 A1 | 10/2019 | Nakamura et al. | |
| 2019/0326879 A1 | 10/2019 | Nakamura et al. | |
| 2019/0357381 A1 | 11/2019 | Maki et al. | |
| 2020/0099359 A1 | 3/2020 | Shin et al. | |
| 2020/0212884 A1 | 7/2020 | Shin et al. | |
| 2020/0235768 A1 | 7/2020 | Ni et al. | |
| 2020/0274520 A1 | 8/2020 | Shin et al. | |
| 2020/0304092 A1 * | 9/2020 | Suzuki | H03H 9/1457 |
| 2020/0304096 A1 * | 9/2020 | Suzuki | H03H 9/02637 |
| 2020/0304097 A1 * | 9/2020 | Suzuki | H03H 9/64 |
| 2020/0328727 A1 * | 10/2020 | Daimon | H03H 9/14547 |
| 2020/0358464 A1 | 11/2020 | Abbott et al. | |
| 2021/0083643 A1 | 3/2021 | Liu et al. | |
| 2021/0105004 A1 | 4/2021 | Komatsu et al. | |
| 2021/0111688 A1 | 4/2021 | Abott et al. | |
| 2021/0111689 A1 | 4/2021 | Abott et al. | |
| 2021/0119650 A1 | 4/2021 | Abott et al. | |
| 2021/0159876 A1 | 5/2021 | Maki et al. | |
| 2021/0159879 A1 | 5/2021 | Caron et al. | |
| 2021/0159880 A1 | 5/2021 | Caron et al. | |
| 2021/0159881 A1 | 5/2021 | Caron et al. | |
| 2021/0203305 A1 | 7/2021 | Maki et al. | |
| 2021/0281223 A1 | 9/2021 | Ripley et al. | |
| 2021/0281239 A1 | 9/2021 | Maki et al. | |
| 2021/0281246 A1 | 9/2021 | Maki et al. | |
| 2022/0077840 A1 | 3/2022 | Caron | |
| 2022/0077842 A1 | 3/2022 | Qin | |
| 2022/0094323 A1 | 3/2022 | Zhang et al. | |
| 2022/0094324 A1 | 3/2022 | Zhang et al. | |
| 2022/0094335 A1 | 3/2022 | Zhang et al. | |
| 2022/0094337 A1 | 3/2022 | Qin | |
| 2022/0103159 A1 | 3/2022 | Shin et al. | |
| 2022/0123715 A1 | 4/2022 | Martin et al. | |
| 2022/0200569 A1 * | 6/2022 | Garcia | H03H 9/564 |
| 2022/0209749 A1 | 6/2022 | Wang et al. | |
| 2022/0271730 A1 | 8/2022 | Abott et al. | |
| 2022/0271734 A1 | 8/2022 | Abott et al. | |
| 2022/0311412 A1 | 9/2022 | Liu et al. | |
| 2022/0311419 A1 | 9/2022 | Komatsu et al. | |
| 2022/0337219 A1 | 10/2022 | Kovacic et al. | |
| 2022/0347947 A1 * | 11/2022 | Wang | B29C 35/0805 |
| 2022/0368312 A1 | 11/2022 | Wang et al. | |
| 2022/0393664 A1 | 12/2022 | Liu et al. | |
| 2022/0407496 A1 | 12/2022 | Hill et al. | |
| 2022/0416758 A1 | 12/2022 | Caron | |
| 2023/0006642 A1 | 1/2023 | Liu et al. | |
| 2023/0013541 A1 | 1/2023 | Caron et al. | |
| 2023/0024270 A1 | 1/2023 | Caron et al. | |
| 2023/0027129 A1 | 1/2023 | Caron et al. | |
| 2023/0048476 A1 | 2/2023 | Cheng et al. | |
| 2023/0103898 A1 | 4/2023 | Abbott et al. | |
| 2023/0106431 A1 | 4/2023 | Abbott et al. | |
| 2023/0109580 A1 | 4/2023 | Abbott et al. | |
| 2023/0137468 A1 * | 5/2023 | Garcia | H03H 9/02157 |
| | | | 333/187 |

(56)　　　　　　References Cited

U.S. PATENT DOCUMENTS

| 2023/0198498 | A1 | 6/2023 | Li et al. | |
|---|---|---|---|---|
| 2023/0283255 | A1 | 9/2023 | Nakamura et al. | |
| 2023/0291385 | A1* | 9/2023 | Okamoto | H03H 9/14541 |
| 2023/0336147 | A1* | 10/2023 | Feld | H03H 9/02102 |
| 2024/0072752 | A1 | 2/2024 | Weng | |
| 2024/0223155 | A1* | 7/2024 | Koulakis | H03H 9/25 |
| 2024/0314500 | A1 | 9/2024 | Chen | |
| 2024/0380378 | A1 | 11/2024 | Yali | |
| 2025/0175158 | A1* | 5/2025 | Ozasa | H03H 9/6483 |

* cited by examiner

100

100

220

231          ANT          232

ACOUSTIC WAVE DEVICES WITH THERMAL BYPASS

CROSS-REFERENCE TO RELATED APPLICATIONS

This application claims the benefit under 35 U.S.C. § 119(e) of U.S. Provisional Patent Application No. 63/223, 916, filed Jul. 20, 2021, and titled ACOUSTIC WAVE DEVICES WITH THERMAL BYPASS. The entirety contents of each of the above-identified application(s) are hereby incorporated by reference herein and made part of this specification for all that they disclose.

BACKGROUND

Technical Field

Embodiments of this disclosure relate to acoustic wave devices, and more particularly to heat management for acoustic wave devices.

Description of Related Technology

Acoustic wave filters can be implemented in radio frequency electronic systems. For instance, filters in a radio frequency front end of a mobile phone can include acoustic wave filters. An acoustic wave filter can include a plurality of acoustic resonators arranged to filter a radio frequency signal. Example acoustic wave filters include surface acoustic wave (SAW) filters and bulk acoustic wave (BAW) filters. SAW filters can include SAW resonators. A SAW resonator of a surface acoustic wave filter typically includes an interdigital transducer electrode on a piezoelectric substrate. A surface acoustic wave resonator is arranged to generate a surface acoustic wave. BAW filters can include BAW resonators. In BAW resonators, acoustic waves propagate in a bulk of a piezoelectric layer. Example BAW resonators include film bulk acoustic wave resonators (FBARs) and solidly mounted resonators (SMRs).

Although various SAW and BAW devices exist, there remains a need for improved SAW and BAW devices and filters, such as with improved heat management.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

In accordance with one aspect of the disclosure, an acoustic wave device can include a substrate, a piezoelectric layer, and an interdigital transducer electrode including a plurality of fingers. The piezoelectric layer can be disposed between the substrate and the interdigital transducer electrode. The interdigital transducer electrode can include a plurality of coupling portions that can extend through at least part of the piezoelectric layer to electrically couple the interdigital transducer electrode to the substrate.

The substrate can be made of a semiconductor material. The substrate can be made of silicon. One or more of the plurality of coupling portions can extend completely through the piezoelectric layer. One or more of the plurality of coupling portions can be in direct contact with the substrate. One or more of the plurality of coupling portions can be in ohmic contact with the substrate. One or more of the plurality of coupling portions can be capacitively coupled to the substrate. A dielectric material can be disposed between the one or more of the plurality of coupling portions and the substrate. The device can include a dielectric layer between the piezoelectric layer and the substrate. One or more of the plurality of coupling portions can extend at least partially through the dielectric layer. One or more of the plurality of coupling portions can extend completely through the dielectric layer. The plurality of coupling portions can be configured to provide a bypass current pathway through the substrate. The interdigital transducer electrode can include a first bus bar with a first coupling portion that electrically couples the first bus bar to the substrate and a second bus bar with a second coupling portion that electrical couples the second bus bar to the substrate.

In accordance with one aspect of the disclosure, an acoustic wave device can include a substrate, a piezoelectric layer, and an interdigital transducer electrode. The piezoelectric layer can be disposed between the substrate and the interdigital transducer electrode. The interdigital transducer electrode can include a first bus bar, second bus bar, a first plurality of fingers extending from the first bus bar toward the second bus bar, and a second plurality of fingers extending towards the first bus bar. A first coupling portion can be on the first bus bar, and can extend through at least part of the piezoelectric layer to electrically couple the first bus bar to the substrate. A second coupling portion can be on the second bus bar, and can extend through at least part of the piezoelectric layer to electrically couple the second bus bar to the substrate.

The substrate can be made of a semiconductor material. The first and second coupling portions can extend completely through the piezoelectric layer. The first and second coupling portions can be in direct contact with the substrate. The first and second coupling portions can be in ohmic contact with the substrate. The first and second coupling portions can be capacitively coupled to the substrate. The device can include a dielectric layer between the piezoelectric layer and the substrate. The first and second coupling portions can extend at least partially through the dielectric layer. The first and second coupling portions can extend completely through the dielectric layer. The first and second coupling portions can be configured to provide a bypass current pathway through the substrate. The device can be a surface acoustic wave (SAW) device. The device can be a multi-layer piezoelectric substrate (MPS) device.

In accordance with one aspect of the disclosure, an acoustic wave device can include a substrate, a piezoelectric layer, and a first electrode between the substrate and the piezoelectric layer. The first electrode can have a first coupling portion that electrically couples the first electrode to the substrate. The device can have a second electrode. The piezoelectric layer can be between the first electrode and the second electrode. The second electrode can have a second coupling portion that electrically couples the second electrode to the substrate.

The substrate can be made of a semiconductor material. The substrate can be made of silicon. The second coupling portion can extend through at least part of the piezoelectric layer. The second coupling portion can completely through the piezoelectric layer. The first and second coupling portions can be in direct contact with the substrate. The first and second coupling portions can be in ohmic contact with the substrate. The first and second coupling portions can be capacitively coupled to the substrate. A dielectric material can be disposed between the first and second coupling portions and the substrate. The device can include a dielectric layer between the first electrode and the substrate. The first and second coupling portions can extend at least partially through the dielectric layer. The first and second coupling portions can extend completely through the dielectric layer. The first and second coupling portions can be configured to provide a bypass current pathway through the substrate. The device can be a bulk acoustic wave (BAW) device.

In accordance with one aspect of the disclosure, an acoustic wave device can include a substrate, a piezoelectric layer, and a first electrode adjacent to the piezoelectric layer. The first electrode can have a first coupling portion that electrically couples the first electrode to the substrate. A second electrode can be adjacent to the piezoelectric layer. The second electrode can have a second coupling portion that electrically couples the second electrode to the substrate.

The substrate can be made of a semiconductor material. At least one of the first and second coupling portions can extend completely through the piezoelectric layer. The first and second coupling portions can be in direct contact with the substrate. The first and second coupling portions can be in ohmic contact with the substrate. The first and second coupling portions can be capacitively coupled to the substrate. The device can include a dielectric layer between the piezoelectric layer and the substrate. The first and second coupling portions can extend at least partially through the dielectric layer. The first and second coupling portions can extend completely through the dielectric layer. The first and second coupling portions can be configured to provide a bypass current pathway through the substrate. The device can be a bulk acoustic wave (BAW) device. The device can be a surface acoustic wave (SAW) device. The device can be a multi-layer piezoelectric substrate (MPS) device.

A filter can include one or more of the acoustic wave devices disclosed herein. The filter can be at least one of a band pass, a band stop filter, a ladder filter, and a lattice filter. A filter can include one or more acoustic wave devices disclosed herein. The filter can form part of at least one of a diplexer, a duplexer, a multiplexer, and a switching multiplexer. A radio frequency module can include an acoustic wave die including at least one filter. The at least one filter can include one or more of the acoustic wave devices disclosed herein. A radio frequency circuit element can be coupled to the acoustic wave die. The acoustic wave die and the radio frequency circuit element can be enclosed within a common module package. A wireless communication device can include an acoustic wave filter including one or more of the acoustic wave devices disclosed herein. An antenna can be operatively coupled to the acoustic wave filter. A radio frequency amplifier can be operatively coupled to the acoustic wave filter and configured to amplify a radio frequency signal. A transceiver can be in communication with the radio frequency amplifier. The wireless communication device can include a baseband processor in communication with the transceiver. The acoustic wave filter can be included in a radio frequency front end. The wireless communication device can be a user equipment.

BRIEF DESCRIPTION OF THE DRAWINGS

Embodiments of this disclosure will now be described, by way of non-limiting example, with reference to the accompanying drawings.

FIG. 27A is a schematic block diagram of a module that includes a power amplifier, a radio frequency switch, and duplexers that include one or more raised frame bulk acoustic wave devices.

FIG. 27B is a schematic block diagram of a module that includes a low noise amplifier, a radio frequency switch, and acoustic wave filters t include one or more raised frame bulk acoustic wave devices.

DETAILED DESCRIPTION

Figure 1:
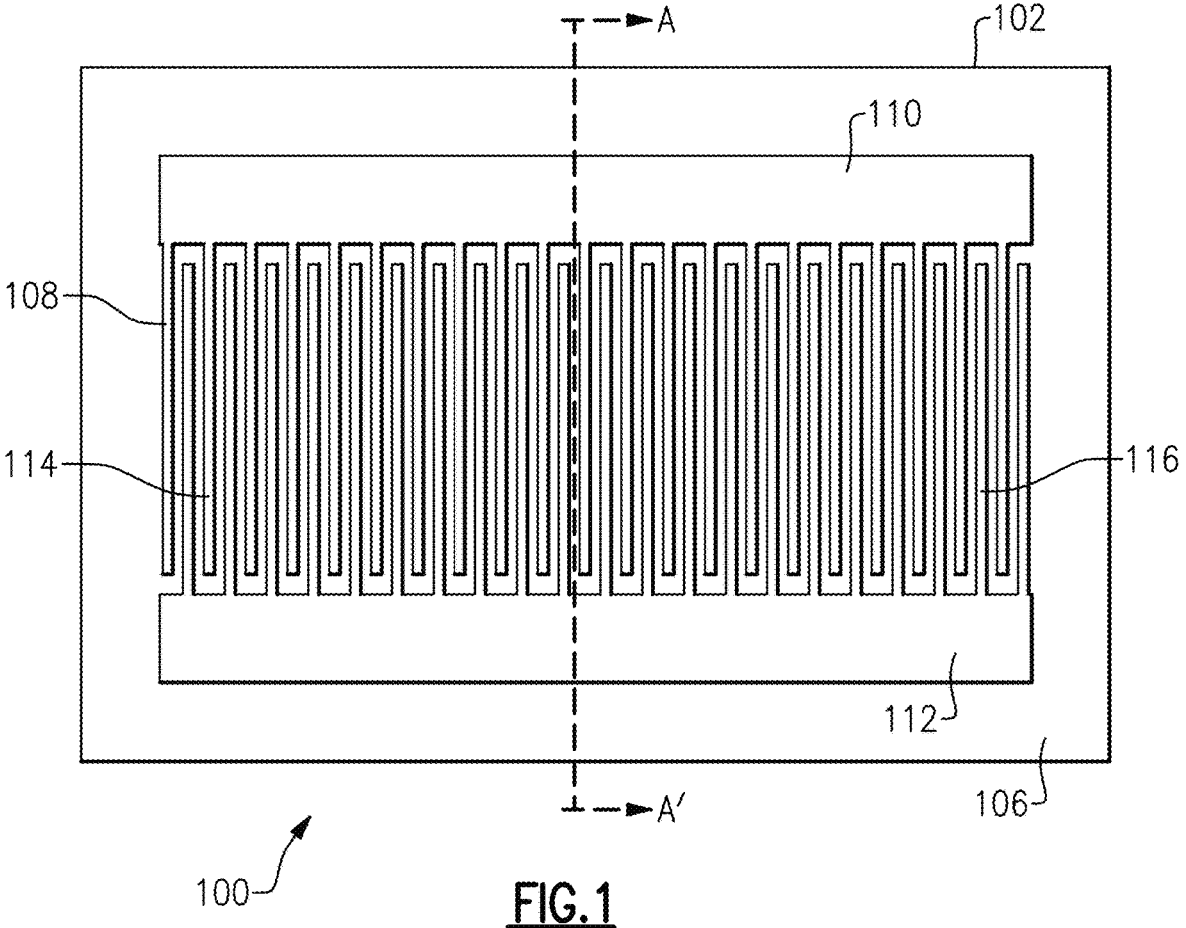
FIG. 1 is a plan view of an example of an acoustic wave device.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic resonators, including surface acoustic wave (SAW), bulk acoustic wave (BAW), and multi-layer piezoelectric substrate (MPS) resonators, can be used in radio frequency (RF) filters and communications systems. In some instances, the acoustic resonators can be exposed to relatively high RF power levels. Acoustic resonators can be limited in terms of how much RF power they can withstand without damage. These power limitations can be exacerbated by heat, such as from external heat sources (e.g. a higher ambient operating temperature), a nearby component (e.g., on a printed circuit board or RF system), or the resonator itself. Self-generated heat can be particularly problematic for high power operation. When an acoustic resonator is exposed to high power levels, some of that power can be dissipated within the resonator, generating heat and raising the temperature of the resonator and the surrounding environment. Under some circumstances, a positive feedback loop can occur where an increase in temperature causes higher levels of power dissipation, which can generate even more heat and can raise the temperature even further. This positive feedback loop can produce a thermal runaway event, such as if the increase in dissipated power outpaces the rate at which heat can be removed (e.g., through the surrounding environment). In some instances, the resonator temperature can rise until it can no longer withstand the applied power levels, which can result in electrical overstress (EOS) and, in some cases, irreparable damage to the resonator.

In some embodiments disclosed herein, an acoustic wave resonator can include electrical contacts from its bus bars directly to the substrate in close proximity to the acoustically active area of the resonator. These contacts can be provided by, for example, patterning via holes through the piezoelectric and dielectric layers to allow the metal bus bars to contact the substrate, which can be high resistant silicon or other semiconductor material. When the resonator is exposed to high levels of RF power, for example, the heat generated within the IDT electrode and/or piezoelectric layer can be conducted through the dielectric layer into the substrate, causing the temperature of the substrate to increase (e.g., for portions of the substrate directly below the acoustically active area and directly adjacent to it). This can create a region of low electrical resistivity within the substrate, which can form a conductive channel in the substrate (e.g., underneath the resonator). Because the electrical terminals of the resonator contact the substrate on either side of the IDT electrode, the conductive channel through the substrate can form a low-impedance path in parallel with the resonator. As temperatures continue to rise, the conductivity of the channel can increase correspondingly, which can result in diverting more and more power away from the resonator. Thus, the conductive channel through the substrate can provide a negative feedback loop which counteracts the thermal runaway phenomenon, thereby protecting the resonator from damage at high power levels.

Figure 2:
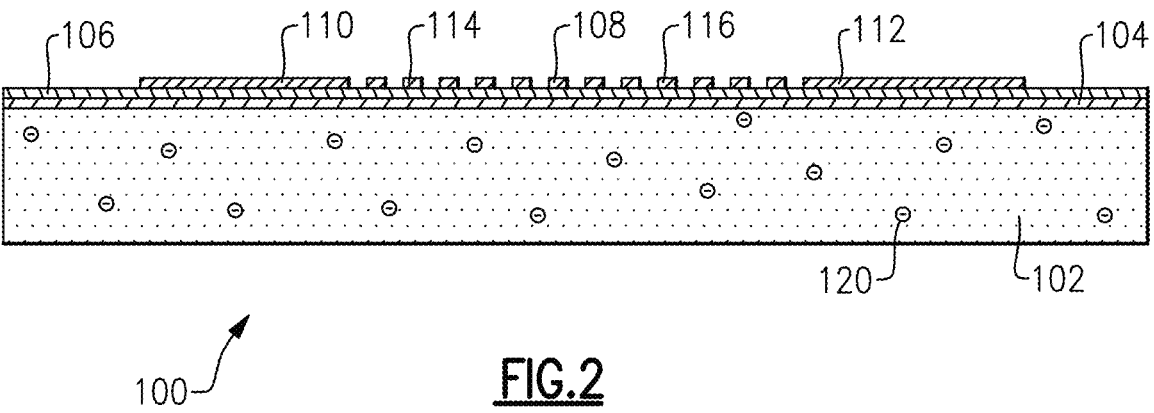
FIG. 2 is a cross-sectional view of an example of an acoustic wave device.

FIG. 1 is a plan view of an example embodiment of an acoustic wave device 100, which can be a surface acoustic wave (SAW) device, such as a multi-layer piezoelectric substrate (MPS) device. FIG. 2 is a cross-sectional view of the acoustic wave device 100 of FIG. 1 taken through the line from A to A'. The device 100 can include a substrate 102, a dielectric layer 104, a piezoelectric layer 106, and an interdigital transducer (IDT) electrode 108. The substrate 102 can be a support substrate, such as a substrate structure (e.g., a layer). The substrate 102 can include (e.g., be made of, consist of) a semiconductor material, such as silicon (Si) (e.g., high resistivity silicon) or gallium arsenide (GaAs), although various other suitable semiconductor materials can be used. The piezoelectric layer 106 can be a lithium based piezoelectric layer. For example, the piezoelectric layer 106 can include (e.g., be made of, consist of) lithium niobate (LiNbO3) or lithium tantalate (LiTaO3), although various other suitable piezoelectric materials can be used.

In some implementations, the substrate 102 can be formed or provided. The piezoelectric layer 106 can be formed or provided over the substrate 102 (e.g., disposed thereon, attached or adhered thereto). In some embodiments, a dielectric layer 104 can be between the substrate 102 and the piezo electric layer 106. For example, the dielectric layer 104 can be formed or provided over the substrate 102 (e.g., disposed thereon, attached or adhered thereto), and the piezoelectric layer 106 can be formed or provided over the dielectric layer 104 (e.g., disposed thereon, attached or adhered thereto). The dielectric layer 104 can include (e.g., be made of, consist of) silicon dioxide (SiO2), for example, although various other oxide materials or other insulating materials could be used.

The IDT electrode 108 can be over the piezoelectric layer 106. The IDT electrode 108 can be formed or provided over the piezoelectric layer 106 (e.g., disposed thereon, attached or adhered thereto). The IDT electrode 108 can include (e.g., be made of, consist of) molybdenum (Mo), tungsten (W), gold (Au), silver (Ag), copper (Cu), platinum (Pt), ruthenium (Ru), titanium (Ti), the like, or any suitable combination thereof, although various suitable conductive materials could be used.

The IDT electrode 108 can have a first bus bar 110 (e.g., an input bus bar) and a second bus bar 112 (e.g., an output bus bar). The IDT electrode 108 can include a first plurality of fingers 114, which can extend from the first bus bar 110 towards the second bus bar 112. The IDT electrode 108 can include a second plurality of fingers 116, which can extend from the first bus bar 110 towards the second bus bar 112. The first fingers 114 can extend along gaps between the second fingers 116, and the second fingers 116 can extend along gaps between the first fingers 114. The fingers 114 and 116 can form an interdigitated structure. Although the line from A to A' extends through a gap between fingers 114 and 116, the cross-sectional views show the interdigitated fingers 114 and 116 as though the cross-section were taken through a line orthogonal to the line from A to A', for ease of illustration.

Figure 3:
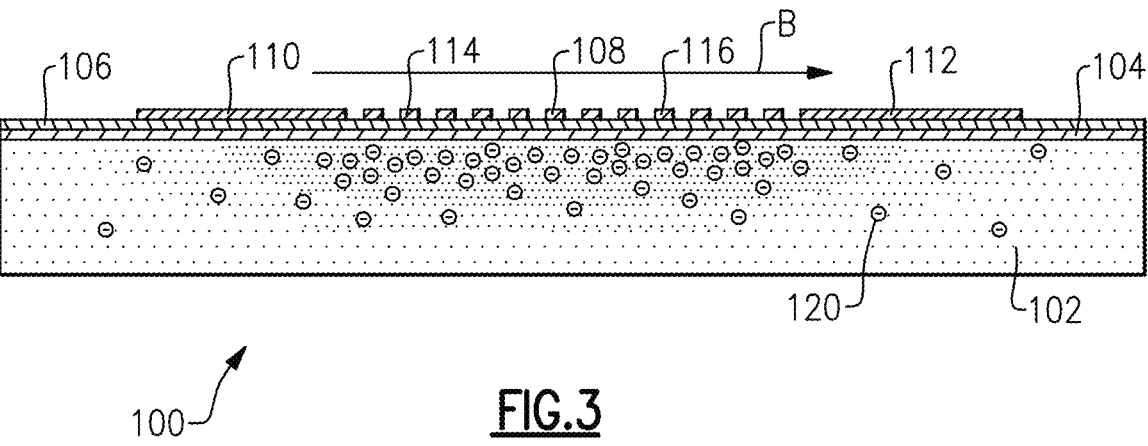
FIG. 3 is a cross-sectional view of an example of an acoustic wave device with current flowing therethrough.

FIG. 3 shows a cross-sectional view of the acoustic wave device 100 with current flowing through the device 100

(e.g., from or the first bus bar 110 to the second bus bar 112). The current is indicated by the arrow B in FIG. 3. As current B flows through the device 100, the temperature of components of the device 100 can increase due to power dissipation. Under some conditions (e.g., relatively low power and/or relatively low ambient temperature), the device 100 can dissipate sufficient heat generated from the power dissipation. However, under some conditions (e.g., relatively high power and/or relatively high ambient temperature), the device 100 may be unable to dissipate sufficient heat, which can result in damage to the device 100 or other components. For example, in some instances an increase in temperature can cause higher levels of power dissipation, which can then generate even more heat, which can then raise the temperature even further, which can produce a thermal runaway event and/or electrical overstress (EOS).

The substrate 102 can include charge carriers 120, which can be electrons, holes, ions, conduction-band carriers, or the like. For example, the substrate 102 can include silicon (Si) or another suitable semiconductor material. The concentration of charge carriers 120 can increase (e.g., exponentially) as the temperature of the substrate 102 increases. For example, as shown in FIG. 3, the charge carriers 120 can be more concentrated at the portion of the substrate 102 that is nearer to the IDT electrode 108. As more heat is delivered to the substrate 102 (e.g., due to higher power levels or higher degrees of heat dissipation), the temperature of the substrate 102 near the IDT electrode 108 can increase, which can increase the concentration of charge carriers 120 in the area of the substrate 102 near the IDT electrode 108. Increasing the concentration of charge carriers 120 in a portion of the substrate 102 can increase the conductivity of that portion of the substrate 102. However, in the device 100 of FIGS. 2 and 3, the IDT electrode 108, and the current B, can be isolated from the portion of the substrate 102 with increased conductivity by the dielectric layer 104 and/or the piezoelectric layer 106, which can each or both be made of an insulating material.

Figure 4:
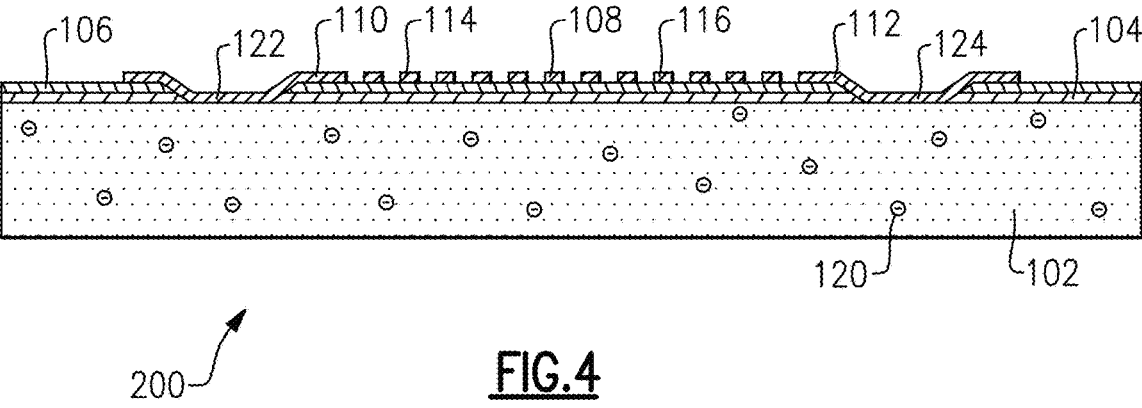
FIG. 4 is a cross-sectional view of an example of an acoustic wave device.

FIG. 4 shows a cross-sectional view of an embodiment of a SAW device 200, which can be a multi-layer piezoelectric substrate (MPS) device, for example. The device 200 can be the same as or similar to the device 100 of FIGS. 1 to 3, except as described herein. The IDT electrode 108 of the device 200 can have one or more coupling portions 122, 124 that can electrically couple the IDT electrode 108 to the substrate 102, such as by direct physical contact between the coupling portions 122, 124 and the substrate 102, ohmic contact between the coupling portions 122, 124 and the substrate 102, or capacitive coupling between the coupling portions 122, 124 and the substrate 102, or the like. The coupling portions 122, 124 can enable current to flow from one side of the IDT electrode 108, through the substrate 102, and to the other side of the IDT electrode 108. The device 200 can enable a portion of the current to bypass the interdigitated fingers 114, 116 by flowing through the substrate 102. The coupling portions 122, 124 can provide a shunt, or a bypass current pathway, through the substrate 102.

The device 200 can have one or more first coupling portions 122, which can be on a first side of the IDT electrode 108, such as on a first side of the fingers 114, 116, such as on the left side of FIG. 4. The device 200 can have one or more second coupling portions 124, which can be on a second side of the IDT electrode 108, such as on a second side of the fingers 114, 116, such as on the right side of FIG. 4. The second side can be opposite the first side. The one or more first coupling portions 122 can be on the first bus bar 110. The one or more second coupling portions 124 can be on the second bus bar 112.

The one or more coupling portions 122, 124 can extend through the piezoelectric layer 106 and the dielectric layer 104, in some embodiments, such to provide direct or ohmic contact between the coupling portion(s) 122, 124 and the substrate 102. The piezoelectric layer 106 can have openings (e.g., holes or gaps) that can extend through some or all of the piezoelectric layer 106. The conductive material of the IDT electrode 108 can extend into or through the openings in the piezoelectric layer 106, such as to form the coupling portions 122, 124. The dielectric layer 104 can have openings (e.g., holes or gaps) that can extend through some or all of the dielectric layer 104. The conductive material of the IDT electrode 108 can extend into or through the openings in the dielectric layer 104, such as to form the coupling portions 122, 124. The openings in the piezoelectric layer 106 and/or the dielectric layer 104 can be formed by etching, drilling, milling, or any other suitable process for removing material. In some cases, the piezoelectric layer 106 and/or the dielectric layer 104 can be formed with the openings, such as by using masking during a deposition process, or any other suitable additive process.

Figure 5:
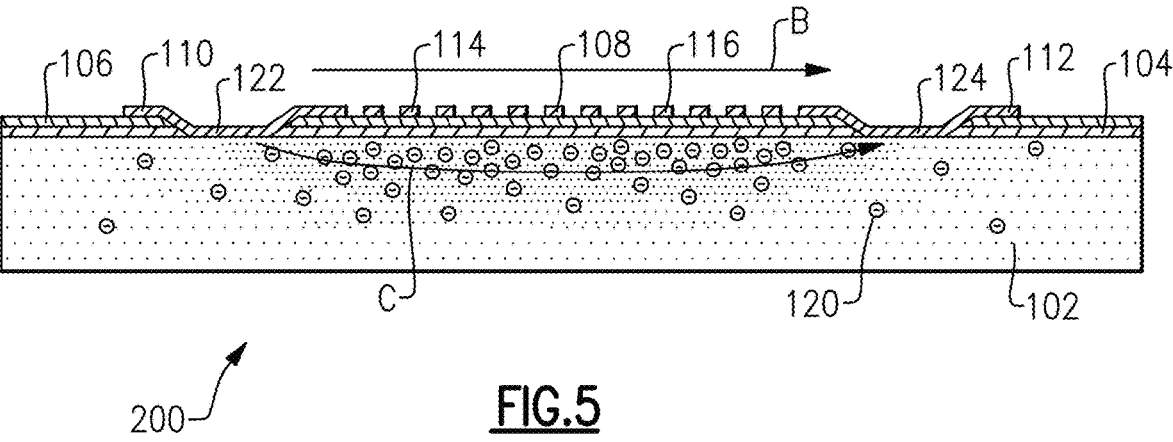
FIG. 5 is a cross-sectional view of an example of an acoustic wave device with current flowing therethrough.

In the example embodiment of FIG. 4, the coupling portions 122, 124 can extend through both the piezoelectric layer 106 and the dielectric layer 104, and the coupling portions 122, 124 can be in direct contact with the substrate 102. The coupling portions 122, 124 can be contact portions, in some embodiments. In FIG. 4, the openings can extend completely through the piezoelectric layer 106 and completely through the dielectric layer 104. With reference to FIG. 5, current (identified by arrow C) can flow from the first side of the IDT electrode 108 (e.g., from the first bus bar 110), through the coupling portion 122 into the substrate 102 (e.g., via the direct contact between the coupling portion 122 and the substrate 102), through the substrate 102 (e.g., when the charge carrier 120 concentration is sufficiently high), out of the substrate 102 and into the coupling portion 124 (e.g., via the direct contact between the coupling portion 124 and the substrate 102), and to the second side of the IDT electrode 108 (e.g., to the second bus bar 112).

Figure 6:
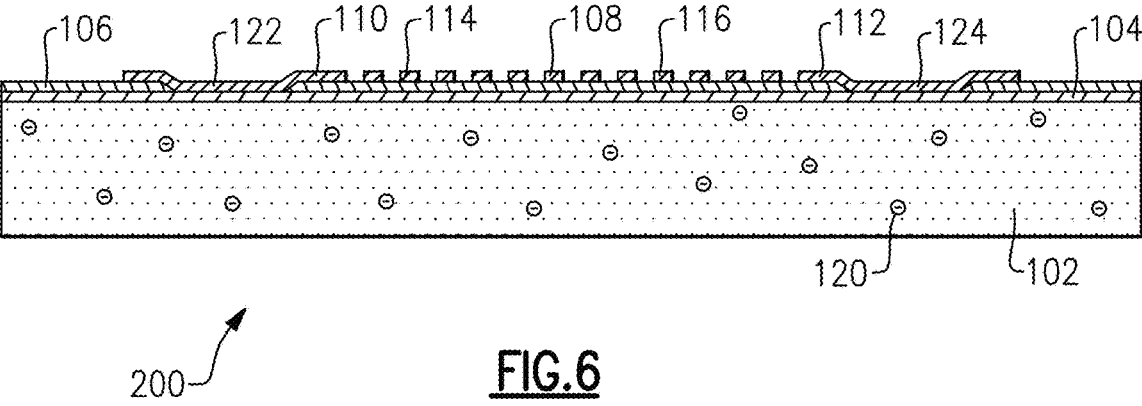
FIG. 6 is a cross-sectional view of an example of an acoustic wave device.
Figure 7:
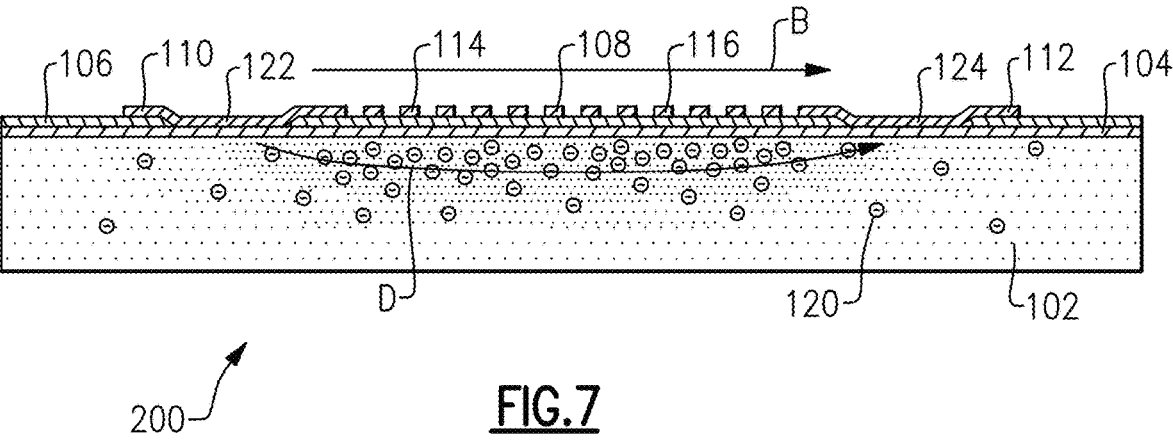
FIG. 7 is a cross-sectional view of an example of an acoustic wave device with current flowing therethrough.

In the example embodiment of FIG. 6, the coupling portions 122, 124 can extend through the piezoelectric layer 106 but not the dielectric layer 104. The coupling portions 122, 124 can be capacitively coupled to the substrate 102. When the temperature of the substrate 102 portion below the coupling portion 122 or 124 is relatively high (e.g., as shown in FIG. 7), that substrate 102 portion can be sufficiently conductive that an effective capacitor can be formed from the coupling portion 122 or 124 (corresponding to a first conductive plate or element of a capacitor), the substrate 102 portion (corresponding to the second conductive plate or element of a capacitor), and the dielectric layer 104 (corresponding to the dielectric material between the conductive plates or elements of a capacitor). Many variations are possible. In some cases, a portion of the dielectric layer 104 can be removed to provide a thinned region of the dielectric layer 104 between the coupling portions 122, 124 and the substrate 102. In some embodiments, only a portion of the piezoelectric layer 104 is removed to form the openings, so that a thinned portion of the piezoelectric layer 104 is between the coupling portions 122, 124 and the substrate 102 (e.g., in some cases along with the dielectric layer 104).

With reference to FIG. 7, current can flow from the first side of the IDT electrode 108 (e.g., from the first bus bar 110 to the second bus bar 112) via the path indicated by arrow D. The electrical energy can couple into the substrate 102 via the coupling portion 122 that is capacitively coupled to the substrate 102 and then out of the substrate 102 via the coupling portion 124 that is capacitively coupled to the substrate 102.

The current through the substrate 102 can function as a shunt or thermal bypass feature that can be used for heat management in the acoustic wave device 200, such as to prevent or impede thermal runaway or electrical overstress events. With reference to FIG. 5, for example, when higher levels of current B flow through the IDT electrode 108 more heat can be produced, such as from power dissipation. The heat can increase the temperature of the underlying portion of the substrate 102, which can increase the charge carrier 120 concentration and the conductivity of the portion of the substrate 102. As the conductivity of the portion of the substrate 102 increases, more current is permitted to flow through the current pathway C through the substrate 102, thereby bypassing the current pathway B (e.g., through or across the IDT electrode 108). As more current C flows through the substrate 102, less current B flows across the IDT electrode 108, which can result in less heat being produced. The temperature of the substrate 102 portion can decrease, which can decrease the charge carrier concentration 120 therein the conductivity thereof. As the conductivity of the substrate 102 portion decreases, less current C can flow through the substrate 102, which can cause more current B to flow across the IDT electrode 108. During operation the system can reach an equilibrium, which can depend on the amount of power or current applied, in some cases. In some cases, the device 200 of FIG. 7 can operate similarly, except for the capacitive couplings discussed herein.

When power is shunted through the bypass pathway in the substrate 102, heat can be generated in the substrate 102. However, the substrate 102 can be configured to manage heat better than the IDT electrode 108, such as due to a larger surface area or volume to dissipate or distribute heat. Also, as the temperature of the substrate 102 increases it can become more conductive, which can result in less heat being produced in the substrate 102. Thus, the heat generated by the bypass pathway through the substrate 102 can be self-regulating, in some cases.

In some cases, during normal operation all or substantially all of the current can flow along current path B across the IDT electrode 108. The bypass current pathway C can only activate when the temperature of the substrate 102 portion reaches levels that are not normally experience during normal operation (e.g., due to excessively high ambient temperature and/or excessively high RF power levels). In some cases, a filter that includes the acoustic wave device 200 may cease to function properly when the bypass through the substrate 102 is active, but the bypass through the substrate 102 can in some cases prevent damage to the device 200 or filter so that the filter can resume normal operation when the temperature is sufficiently reduced.

Features and parameters of the device 200 can be adjusted to change a threshold temperature at which the thermal bypass activates. For example, the material of the substrate 102 can affect the threshold temperature. For example, a substrate material that increases conductivity at lower temperature can activate the bypass pathway at lower temperatures. The size and/or location of the coupling portions 122, 124 can affect the threshold temperature.

Figure 8:
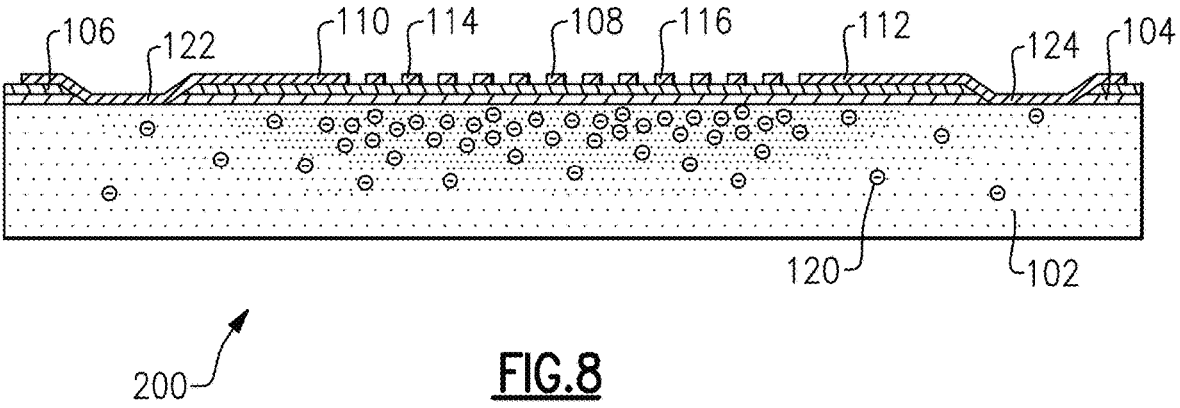
FIG. 8 is a cross-sectional view of an example of an acoustic wave device.

Generally, coupling portions 122, 124 that are positioned closer to the acoustically active region of the device (e.g., the fingers 114, 116) can enable current to more easily flow into or through the substrate 102 and can provide lower threshold temperatures, whereas coupling portions 122, 124 that are further spaced apart from each other can be more restrictive to current flowing into or through the substrate 102 and can provide higher threshold temperatures. For example, FIG. 8 shows an example device 200 with the coupling portions 122, 124 spaced further away from the fingers 114, 116, as compared to FIG. 5. This can cause the areas of the substrate 102 adjacent to the coupling portions 122, 124 to be exposed to less of the heat that is generated by operation of the device 200. In some cases, an area of the substrate 102 under the fingers 114, 116 can have a sufficiently high temperature to be conductive while the areas of the substrate under the coupling portions 122, 124 can have a lower temperature that does not make the substrate conductive. For example, the bypass pathway in the device 200 of FIG. 8 can be inactive whereas the bypass pathway in the device 200 of FIG. 5 would be active under the same conditions. The distance between the coupling portions 122, 124 and the nearest fingers 114, 116 can be about 1 micron, about 2 microns, about 3 microns, about 5 microns, about 7 microns, about 10 microns, about 15 microns, about 20 microns, about 25 microns, about 30 microns, about 40 microns, about 50 microns, about 60 microns, about 70 microns, about 80 microns, about 90 microns, about 100 microns or more, or any values or ranges between any of these values (e.g., between about 3 microns and about 30 microns), although other values could be used in some implementations.

Figure 9:
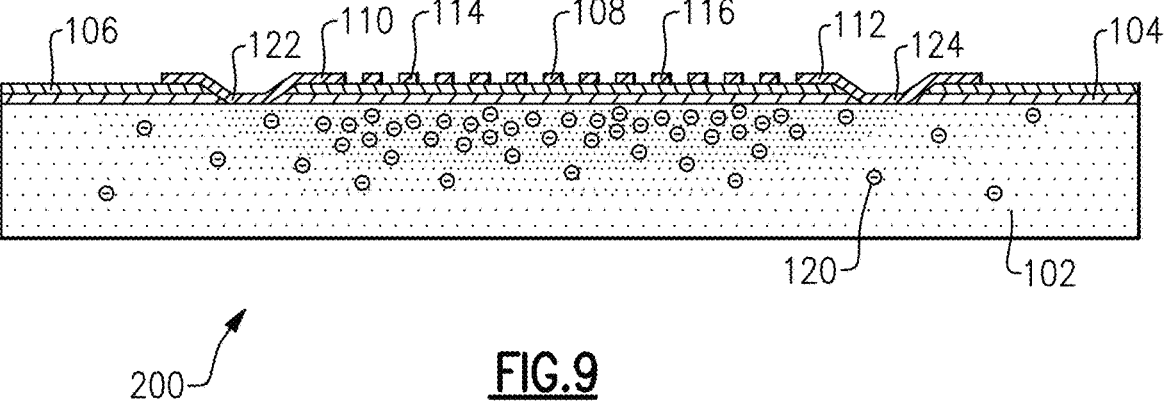
FIG. 9 is a cross-sectional view of an example of an acoustic wave device.

Generally, larger coupling portions 122, 124 can enable current to more easily flow into or through the substrate 102 and can provide lower threshold temperatures, whereas smaller coupling portions 122, 124 be more restrictive to current flowing into or through the substrate 102 and can provide higher threshold temperatures. For example, FIG. 9 shows an example device 200 with coupling portions 122, 124 that are smaller in size than the coupling portions 122, 124 of FIG. 5. The bypass pathway in the device 200 of FIG. 8 can be inactive whereas the bypass pathway in the device 200 of FIG. 5 would be active under the same conditions.

Figure 10:
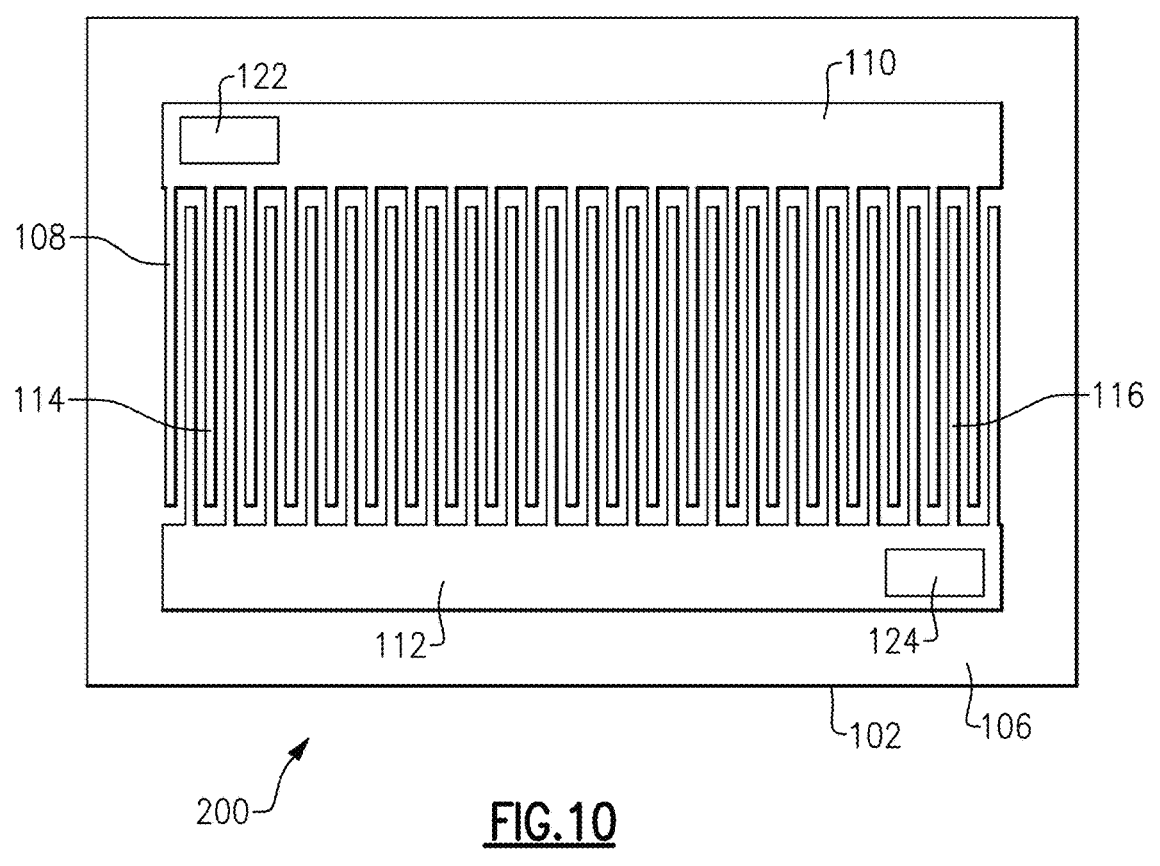
FIG. 10 is a plan view of an example of an acoustic wave device.
Figure 11:
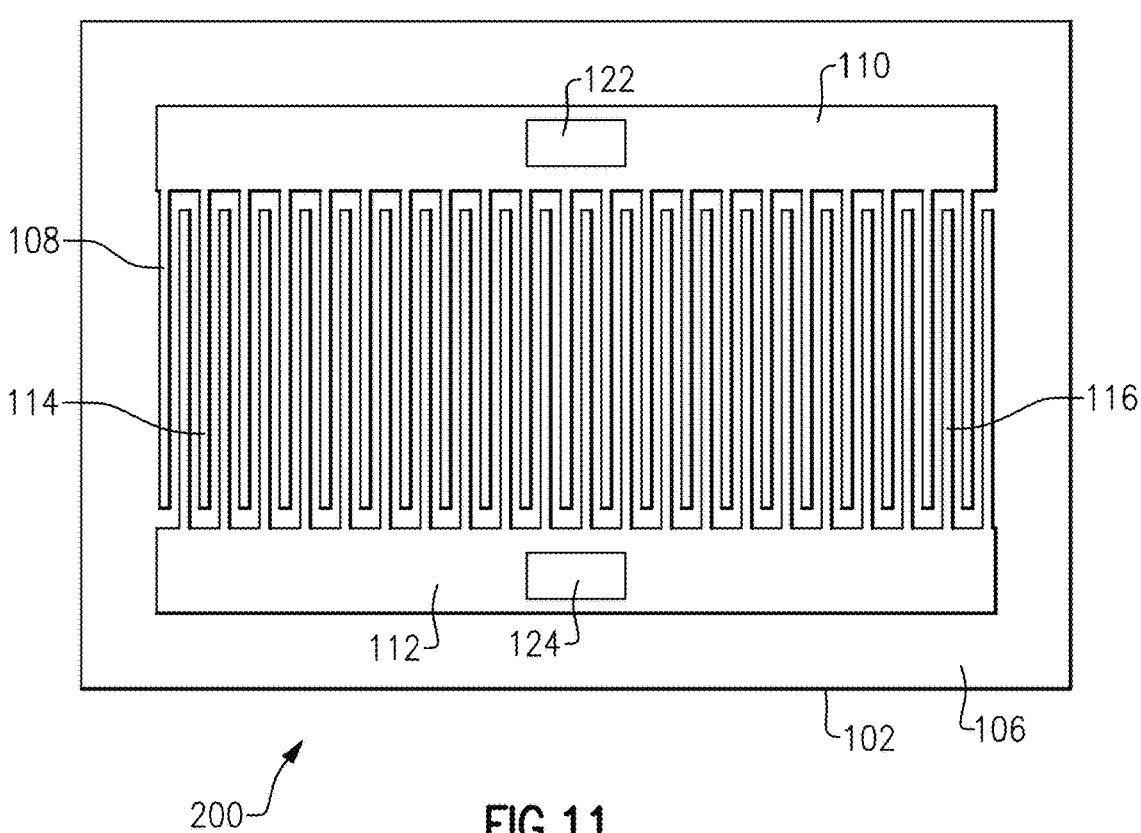
FIG. 11 is a plan view of an example of an acoustic wave device.

Generally, coupling portions 122, 124 that are positioned closer to each other can enable current to more easily flow into or through the substrate 102 and can provide lower threshold temperatures, whereas coupling portions 122, 124 that are further spaced apart from each other can be more restrictive to current flowing into or through the substrate 102 and can provide higher threshold temperatures. For example, FIG. 10 shows an example device 200 with coupling portions 122, 124 that are spaced further apart, while FIG. 11 shows an example device 200 with coupling portions 122, 124 that are positioned closer together. The bypass pathway in the device 200 of FIG. 10 can be inactive whereas the bypass pathway in the device 200 of FIG. 11 would be active under the same conditions.

In some embodiments, the first coupling portion 122 can be at or near a first end of the IDT electrode 108 (e.g., at a first end of the first bus bar 110, such as the left side in FIG. 10), and the second coupling portion 122 can be at or near a second end (e.g., opposite the first end) of the IDT electrode 108 (e.g., at a second end of the second bus bar 112, such as the right side in FIG. 10). In some embodiments, the first coupling portion 122 can be positioned directly across from the second coupling portion 124, as shown for example in FIG. 13. A line extending parallel to the fingers 114, 116 can intersect the first coupling portion 122 and the second coupling portion 124 (e.g., in the embodiment of FIG. 13), or does not intersect both of the coupling portions 122, 124 (e.g., in the embodiment of FIG. 12).

Figure 12:
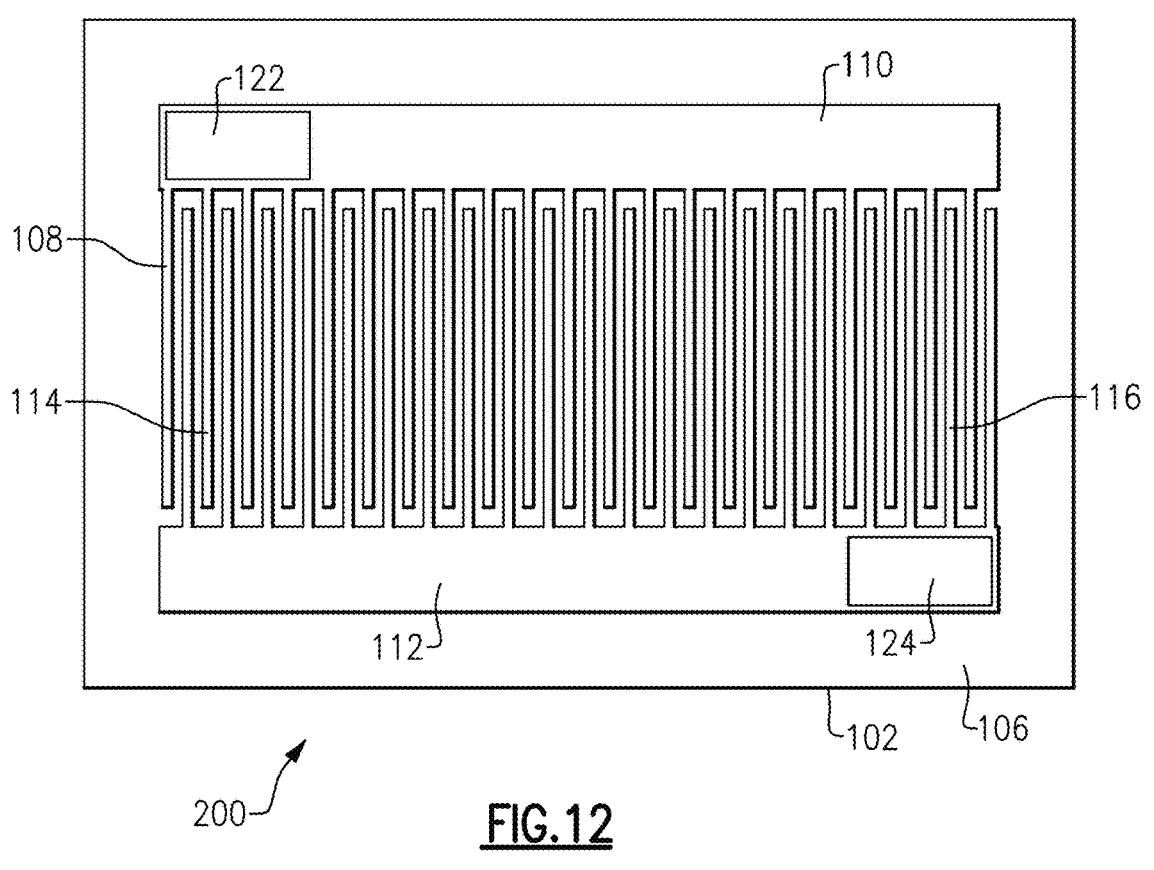
FIG. 12 is a plan view of an example of an acoustic wave device.
Figure 13:
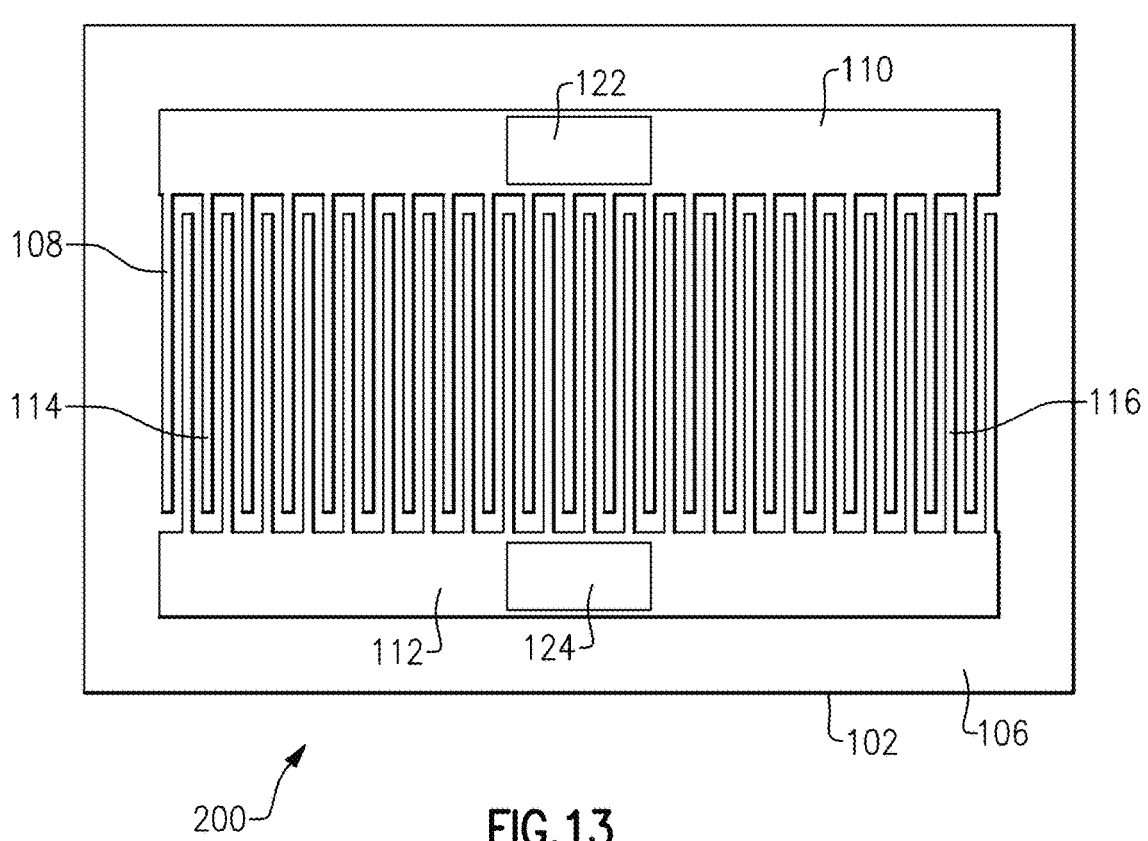
FIG. 13 is a plan view of an example of an acoustic wave device.

FIG. 12 shows an example of a device 200 with the coupling portions 122, 124 at opposite ends, but with larger coupling portions 122, 124 than in FIG. 10. FIG. 13 shows an example of a device 200 with the coupling portions 122, 124 positioned directly across from each other, but with larger coupling portions 122, 124 than in FIG. 11. As between the examples of FIGS. 10-13, the embodiment of FIG. 10 can have the highest temperature threshold to activate the bypass, and the embodiment of FIG. 13 can have the lowest temperature threshold to activate the bypass. The embodiments of FIGS. 11 and 12 can have temperature thresholds that activate the bypass that are between those of FIGS. 10 and 13. In some cases, the embodiment of FIG. 11 (e.g., with the smaller contact portions 122, 124 that are positioned closer together) can have a temperature threshold for activating the bypass that is lower than, larger than, or equal to the embodiment of FIG. 12 (e.g., with the larger contact portions 122, 124 that are positioned further apart), depending on the particular parameters. The device 200 can be configured to operate with temperature that is sufficiently high to activate the bypass, and that is low enough to impede damage to the device 200 (e.g., by cracking or melting the electrodes or other component). By way of example, the device 200 can be configured to operate (e.g., at equilibrium) at about 150 degrees C., about 175 degrees C., about 200 degrees C., about 225 degrees C., about 250 degrees C., about 275 degrees C., about 300 degrees C., about 325 degrees C., about 350 degrees C., about 375 degrees C., about 400 degrees C., about 425 degrees C., about 450 degrees C., about 475 degrees C., about 500 degrees C. or more, or any value or ranges between any of these values (e.g., between about 200 degrees C. and about 300 degrees C.), although other values can be used in some implementations.

Figure 14:
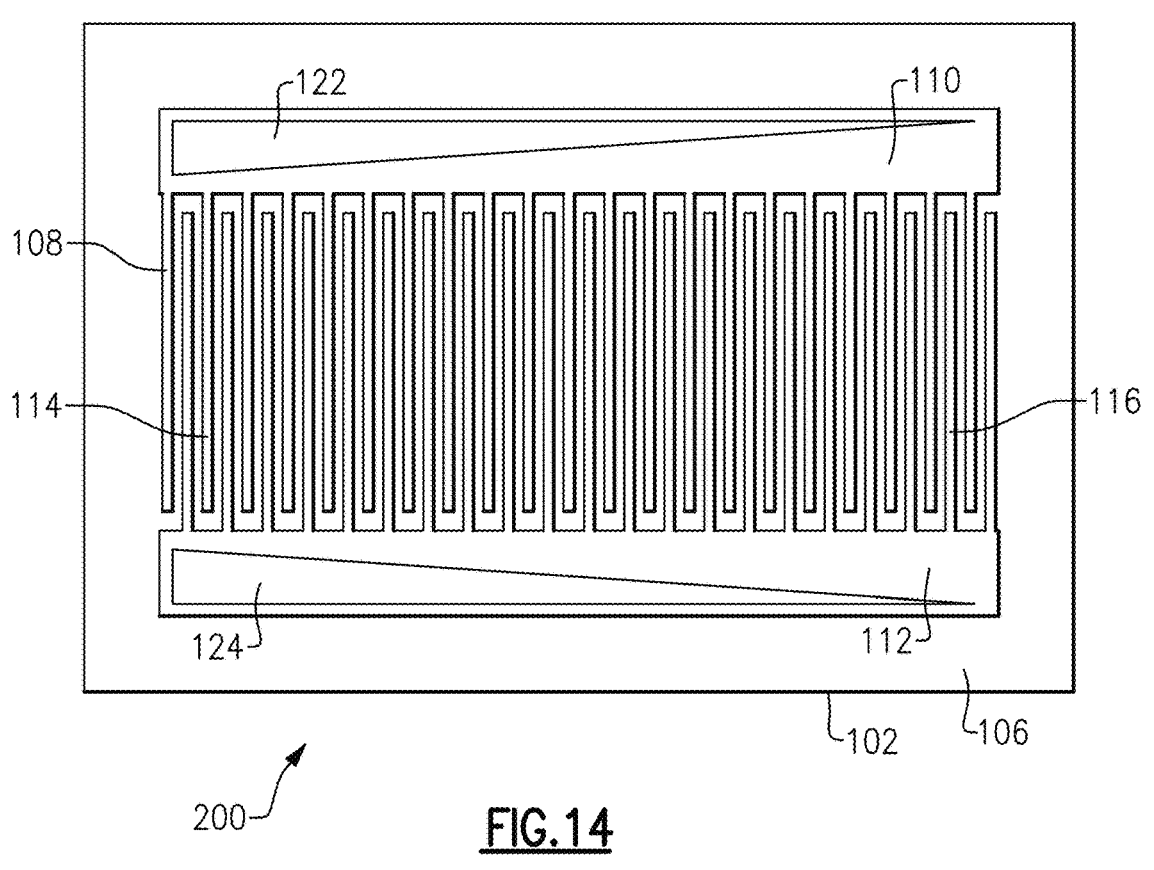
FIG. 14 is a plan view of an example of an acoustic wave device.
Figure 15:
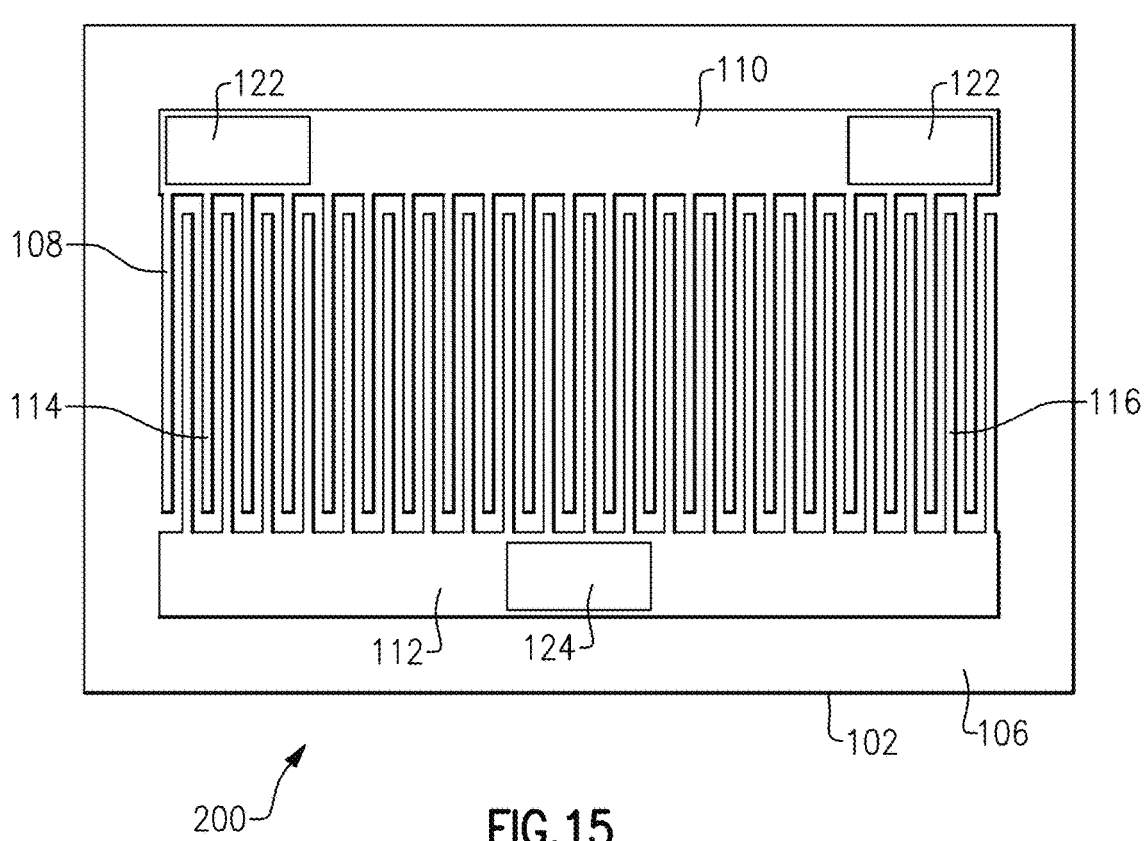
FIG. 15 is a plan view of an example of an acoustic wave device.

Various different types of coupling portions 122, 124 can be used, such as having various sizes, shapes, and positions. In FIG. 14, the contact portions 122, 124 can extend along substantially the full length or at least a majority of the length of the IDT electrode 108 (e.g., of the lengths of the respective bus bars 110, 112). The length of the coupling portion 122 and/or 124 can be at least about 99%, about 95%, about 90%, about 85%, about 80%, about 75%, about 70%, about 65%, about 60%, about 55%, about 50%, about 45%, about 40%, about 35%, about 30%, or about 25%, or about 20%, or about 15%, of the length of the IDT electrode 108 (e.g., of the length of a corresponding bus bar 110 and/or 112), or any values or ranges between any of these values, although other sizes could be used in other configurations. These configurations can facilitate more even distribution of the bypass current through the substrate 102, which can be beneficial for distributing or dissipating heat in or from the substrate 102. In some cases, a side of the IDT electrode 108 (e.g., the first bus bar 110 and/or the second but bar 112) can have multiple coupling portions 122, 124. For example, FIG. 154 shows two coupling portions 122 on the first bus bar 110. This can also facilitate more even distribution of the bypass current through the substrate 102. In some cases, the total combined length of multiple coupling portions 122, 124 can have the values or ranges identified above. Some embodiments, can have multiple coupling portions 122, 124 on one side and a single coupling portion 122, 124 on the other side (e.g., as shown in FIG. 15), although in some cases both sides can have multiple coupling portions 122, 124.

Also, in some cases, the coupling portions 122, 124 that are capacitively coupled to the substrate (e.g., FIGS. 6 and 7) can have a higher threshold temperature for activating the bypass, as compared to similar designs that have coupling portions 122, 124 that have direct contact or ohmic contact with the substrate 102 (e.g., FIGS. 4 and 5). In some embodiments, one or more first coupling portions 122, 124 (e.g., on one side of the IDT electrode 108) can be capacitively coupled to the substrate 102, while one or more second coupling portions 122, 124 (e.g., on the other side of the IDT electrode 108) can have direct or ohmic contact with the substrate 102.

The coupling portions 122, 124 can have various shapes, such as circles, rectangles, polygons, triangles. In some embodiments, the coupling portions 122, 124 an be tapered, stepped, or angled so that they are spaced further apart on one area (e.g., on the right in FIG. 14) and spaced closer together in another area (e.g., on the left in FIG. 14), and/or so that the one side or portion of the coupling portions 122, 124 can have a larger area (e.g., on the left in FIG. 14), and so that another side or portion of the coupling portions 122, 124 can have a smaller area (e.g., on the right in FIG. 14). This can be used to facilitate more even distribution of the bypass current through the substrate 102, such as depending on the locations where the current is delivered to the IDT electrode 108 (e.g., to the bus bars 110, 112).

Many variations are possible. In some embodiments, the dielectric layer 104 can be omitted. For example, the coupling portions 122, 124 can extend through some or all of the piezoelectric layer 106 to electrically couple with the substrate. In some cases, the layer 104 between substrate a 102 and the piezoelectric layer 106 can be a passivation layer. Additional layers and features can be included, such as according to design considerations for acoustic wave devices. Any suitable combination of features of the acoustic wave devices disclosed herein can be combined with each other. Any of the acoustic wave devices disclosed herein can be an acoustic wave resonator (e.g., a SAW resonator or an MPS resonator) in a filter, such as arranged to filter a radio frequency signal.

Figure 16:
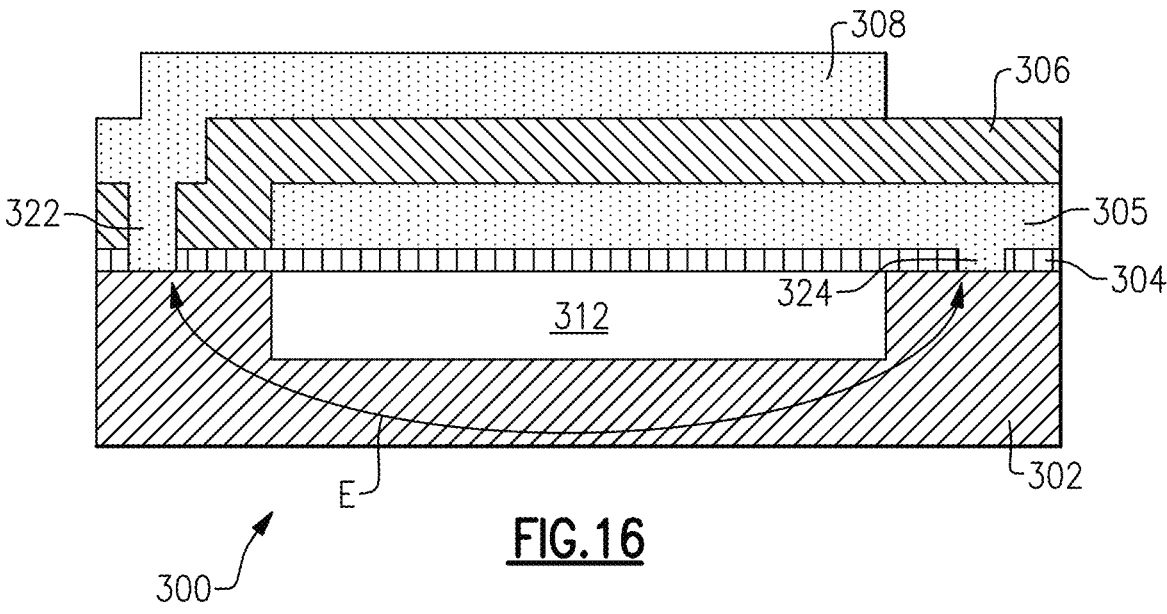
FIG. 16 is a cross-sectional view of an example of an acoustic wave device.

In some embodiments, a bulk acoustic wave (BAW) device can include shunt or thermal bypass features similar to those discussed herein. FIG. 16 shows an example acoustic wave device 300 (e.g., a BAW device) that can include bypass features similar to the acoustic wave device 200. The device 300 can include a substrate 302, a cavity 112, a dielectric layer 304 or passivation layer, a first or lower electrode 305, a piezoelectric layer 306, and a second or upper electrode 308. The substrate 302 can be a support substrate, such as a substrate structure (e.g., a layer). The substrate 302 can include (e.g., be made of, consist of) a semiconductor material, such as silicon (Si) (e.g., high resistivity silicon) or gallium arsenide (GaAs), although various other suitable semiconductor materials can be used. The piezoelectric layer 306 can include (e.g., be made of, consist of) aluminum nitride (AlN), although any other suitable piezoelectric material can be used. The lower electrode 305 and/or the upper electrode 308 can have a relatively high acoustic impedance. For example, the lower electrode 305 and/or the upper electrode 308 can include (e.g., be made of, consist of) molybdenum (Mo), tungsten (W), ruthenium (Ru), iridium (Jr), platinum (Pt), Ir/Pt, or any suitable alloy and/or combination thereof, although other suitable conductive materials could be used. The upper electrode 308 can be formed of the same material as the lower electrode 305 in certain instances, although different materials can be used for the lower electrode 305 and the upper electrode 308, in some cases.

One or more layers 304, such as a passivation layer or a dielectric layer, can be positioned between the lower electrode 305 and the substrate 302. The dielectric or passivation layer 304 can include (e.g., be made of, consist of) silicon dioxide (SiO2), for example, although various other oxide materials or other insulating materials could be used. A cavity 312 can be included, such as below the first or lower electrode 305, or below the passivation layer 304. The cavity 312 can be filled with air, in some implementations. The cavity 312 can be defined by the geometry of the first electrode 305 (or passivation layer 304) and the substrate 302. The cavity 312 can be an acoustic resonance cavity.

The first or lower electrode 305 can be positioned over the support substrate 302, a piezoelectric layer 306 can be positioned over the lower electrode 305. A second or upper electrode 308 can be positioned over the piezoelectric layer 306. The piezoelectric layer 306 can be disposed between the first electrode 305 and the second electrode 308. The piezoelectric layer 306 can be an aluminum nitride (AlN) layer or any other suitable piezoelectric layer.

In some implementations, the substrate 302 can be formed or provided. The cavity 312 can be formed in the substrate material (e.g., by etching or masked deposition or any other suitable technique). The passivation layer or dielectric layer 304 can be formed or provided over the substrate 302 (e.g., disposed thereon, attached or adhered thereto). The lower electrode 305 can be formed or provided over the substrate 302 or over the layer 304 (e.g., disposed thereon, attached or adhered thereto). The piezoelectric layer 306 can be formed or provided over the lower electrode 305 (e.g., disposed thereon, attached or adhered thereto). The upper electrode 308 can be formed or provided over the piezoelectric layer 306 (e.g., disposed thereon, attached or adhered thereto).

The upper electrode 308 can have at least one coupling portion 322 that is electrically coupled to the substrate 302, such as by direct contact, ohmic contact, or capacitive coupling between the substrate 302 and the coupling portion 322 of the upper electrode 308. The coupling portion 322 can extend into or through a portion of the piezoelectric layer 306. The coupling portion 322 can extend into or through a portion of the layer 304. The piezoelectric layer 306 can have at least one opening (e.g., a hole or gap) that can extend through some or all of the piezoelectric layer 306. The layer 304 can have at least one opening (e.g., a hole or gap) that can extend through some or all of the layer 304. The conductive material of the upper electrode 308 can extend into or through the opening in the piezoelectric layer 306 and/or into or through the opening in the layer 304, such as to form the coupling portions 322. In some cases, a portion of the dielectric layer 304 and/or a portion of the piezoelectric layer 306 can be disposed between the coupling portion 322 and the substrate 302, such that the coupling portion 322 and the substrate 302 can be capacitively coupled, as described herein (e.g., similar to FIGS. 6 and 7).

The lower electrode 305 can have at least one coupling portion 324 that is electrically coupled to the substrate 302, such as by direct contact, ohmic contact, or capacitive coupling between the substrate 302 and the coupling portion 324 of the lower electrode 305. The coupling portion 324 can extend into or through a portion of the layer 304. The layer 304 can have at least one opening (e.g., a hole or gap) that can extend through some or all of the layer 304. The conductive material of the lower electrode 305 can extend into or through the opening in the layer 304, such as to form the coupling portions 324. In some cases, a portion of the dielectric layer 304 can be disposed between the coupling portion 324 and the substrate 302, such that the coupling portion 324 and the substrate 302 can be capacitively coupled, as described herein (e.g., similar to FIGS. 6 and 7). Since the lower electrode 305 can be below the piezoelectric layer 305, the coupling portion 324 of the lower electrode 305 does not extend into or through the piezoelectric layer 306.

The openings in the piezoelectric layer 306 and/or the layer 304 can be formed by etching, drilling, milling, or any other suitable process for removing material. In some cases, the piezoelectric layer 306 and/or the layer 304 can be formed with the openings, such as by using masking during a deposition process, or any other suitable additive process.

In the example embodiment of FIG. 16, the coupling portions 322, 324 can be in direct or ohmic contact with the substrate 302. The coupling portions 322, 324 can be contact portions, in some embodiments. In FIG. 16, the openings can extend completely through the piezoelectric layer 306 and/or completely through the layer 304 (e.g., dielectric layer). With reference to FIG. 16, current (identified by arrow E) can flow between the upper electrode 308, through the coupling portion 322 into the substrate 302 (e.g., via the contact between the coupling portion 322 and the substrate 302), through the substrate 302 (e.g., when the charge carrier concentration is sufficiently high), out of the substrate 302 and into the coupling portion 324 (e.g., via the contact between the coupling portion 324 and the substrate 302), and to the lower electrode 305. The embodiments with capacitive coupling between the coupling portions 322, 324 and the substrate 302 can work similarly, but with capacitive coupling, as discussed in connection with FIGS. 6 and 7, for example.

The current E through the substrate 302 can function as a shunt or thermal bypass feature that can be used for heat management in the acoustic wave device 300, such as to prevent or impede thermal runaway or electrical overstress events. With reference to FIG. 16, for example, when higher levels of current flow between the electrodes 305, 308 (e.g., through the piezoelectric layer 306), more heat can be produced, such as from power dissipation. The heat can increase the temperature of the underlying portion of the substrate 302, which can increase the charge carrier concentration and the conductivity of the portion of the substrate 302. As the conductivity of the portion of the substrate 302 increases, more current is permitted to flow through the current pathway E through the substrate 302, thereby bypassing the normal current pathway (e.g., through piezoelectric layer 306). As more current E flows through the substrate 302, less current flows across the normal operating pathway, which can result in less heat being produced. The temperature of the substrate 302 portion can decrease, which can decrease the charge carrier concentration therein and the conductivity thereof. As the conductivity of the substrate 302 portion decreases, less current E can flow through the substrate 302, which can cause more current to flow through the normal operating pathway. During operation the system can reach an equilibrium, which can depend on the amount of power or current applied, in some cases. The coupling portions 322, 324 (or the contacts between the electrodes 205, 208 and the substrate 302) can be on opposite sides of the cavity 312 so that the bypass current E passes under the cavity 312, such as in the cross-section of FIG. 16, or they can be on the same side of the cavity 312 so that the bypass current E does not need to pass under the cavity 312.

Figure 17:
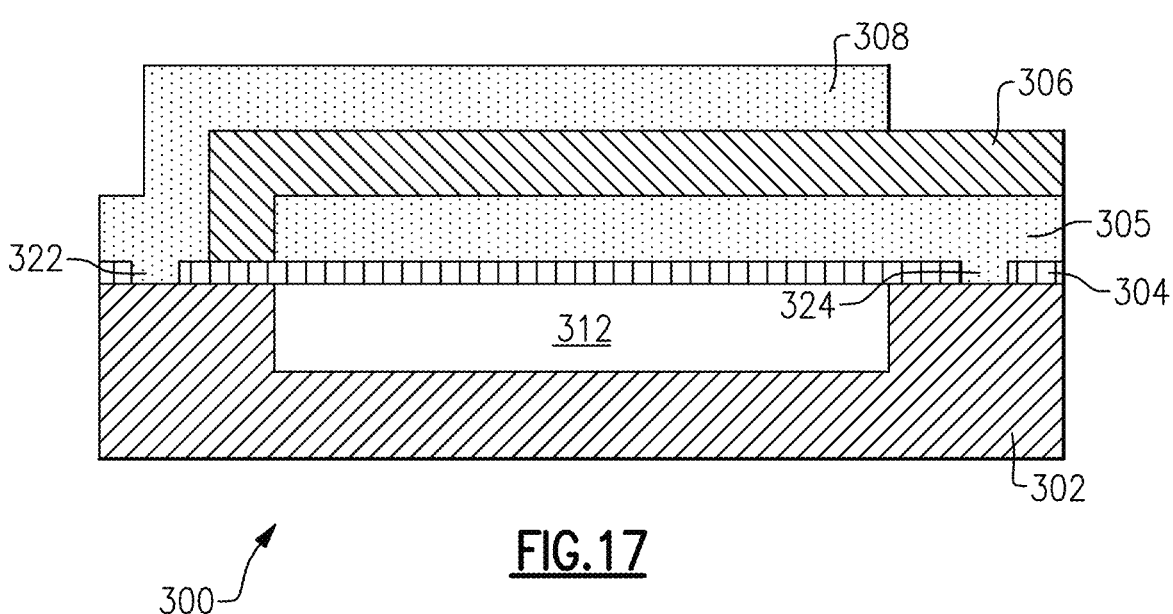
FIG. 17 is a cross-sectional view of an example of an acoustic wave device.

Many variations are possible. With reference to FIG. 17, in some embodiments, the upper electrode 308 can extend laterally past an end of the piezoelectric layer 306. Accordingly, in some cases, the coupling portion 322 of the upper electrode 308 does not extend into or through the piezoelectric layer 306. For example, in some cases, the coupling portions 322, 324 can both extend into or through the layer 304, which can be a dielectric layer, a passivation layer, or an insulating layer, and/or a support layer that supports the lower electrode 305, and can include silicon dioxide, or another oxide material, or any other suitable material.

Figure 18:
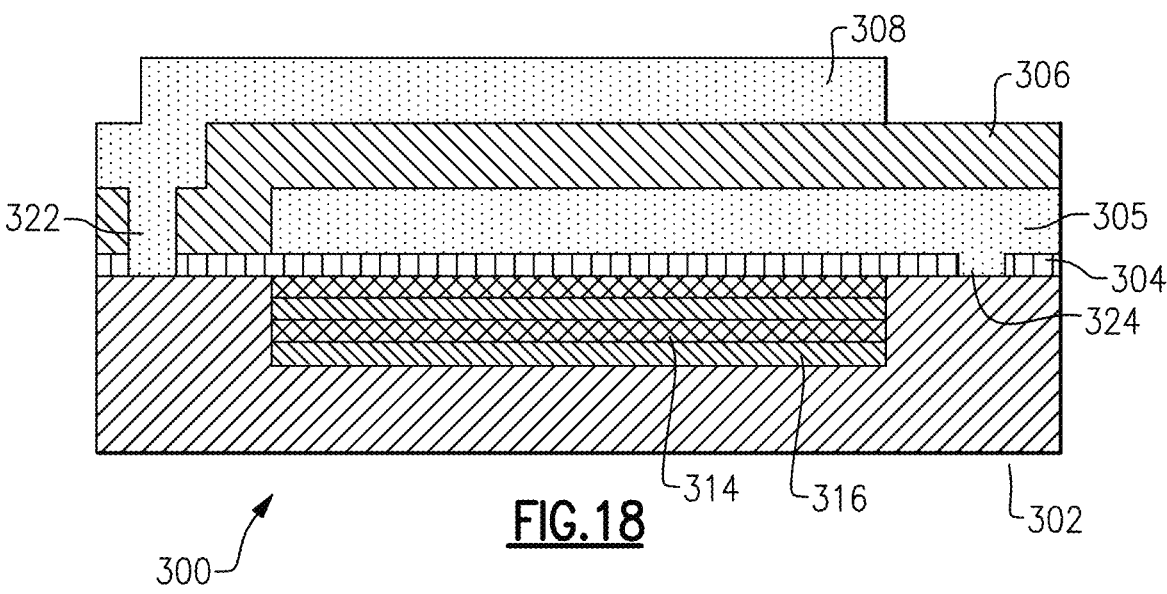
FIG. 18 is a cross-sectional view of an example of an acoustic wave device.
Figure 19:
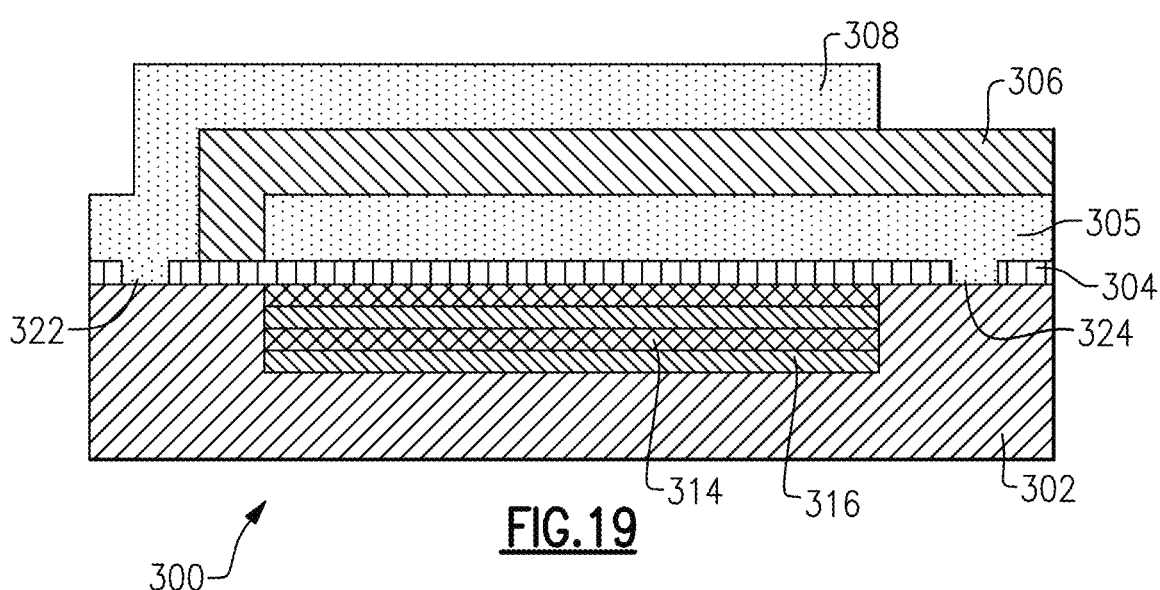
FIG. 19 is a cross-sectional view of an example of an acoustic wave device.

The BAW device 300 can be a film bulk acoustic wave resonator (FBAR). A cavity 312 can be included, such as below the first or lower electrode 305. Although some of the BAW devices illustrated and described herein are FBAR devices, any suitable principles and advantages discussed herein can be applied to a solidly mounted resonator (SMR). FIG. 18 is a cross-sectional view of an example embodiment of a BAW device 300, which can be similar to the embodiment of FIG. 16, except that it is an SMR instead of an FBAR. In the BAW device 300 of FIG. 18, a solid acoustic mirror can be disposed between the first electrode 305 and a silicon substrate 302. The illustrated acoustic mirror can include acoustic Bragg reflectors. The illustrated acoustic Bragg reflectors include alternating low impedance layers 314 and high impedance layers 316. As an example, the Bragg reflectors can include alternating silicon dioxide layers as low impedance layers 314 and tungsten layers as high impedance layers 316, although other suitable materials could be used. Each of the examples of FIG. 16-21 can be implemented with a cavity 312 (e.g., as an FBAR) or with a solid acoustic mirror (e.g., as an SMR). For example, FIG. 19 is a cross-sectional view of an example embodiment of a BAW device 300, which can be similar to the embodiment of FIG. 17 except that it is an SMR instead of an FBAR. In the BAW device 300 of FIG. 19, a solid acoustic mirror can be disposed between the first electrode 305 and a silicon substrate 302. The illustrated acoustic mirror can include acoustic Bragg reflectors (e.g., similar to FIG. 18). In the embodiment of FIG. 19, the upper electrode 308 can extend laterally past an end of the piezoelectric layer 306.

Additional layers and features can be included, such as according to design considerations for acoustic wave devices. Any suitable combination of features of the acoustic wave devices disclosed herein can be combined with each other. Any of the acoustic wave devices disclosed herein can be an acoustic wave resonator (e.g., a BAW resonator) in a filter, such as arranged to filter a radio frequency signal.

Figure 20:
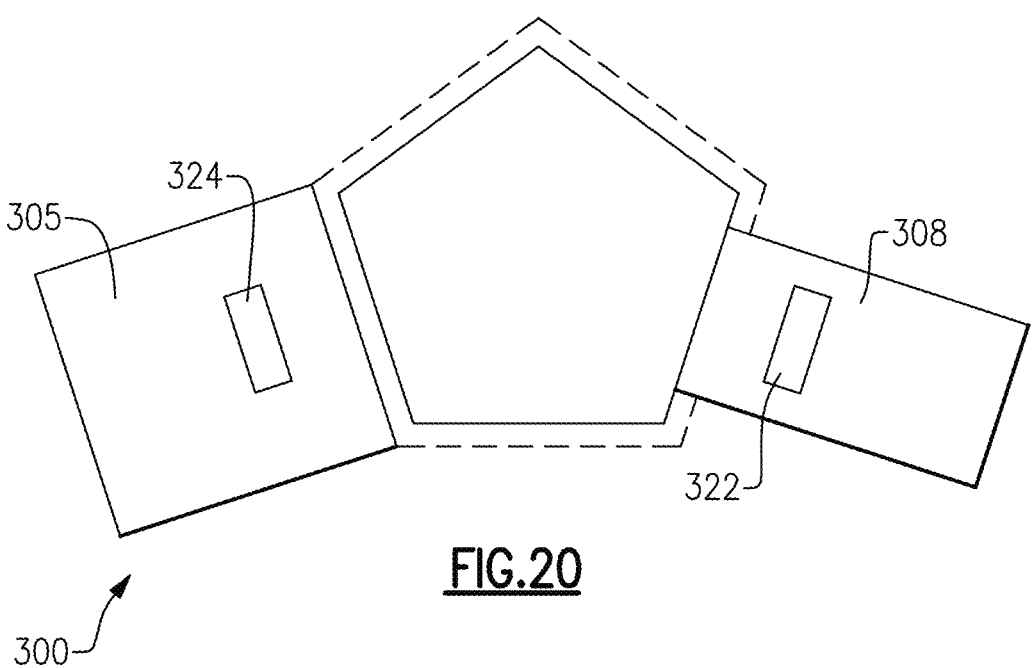
FIG. 20 is a plan view of an example of an acoustic wave device.
Figure 21:
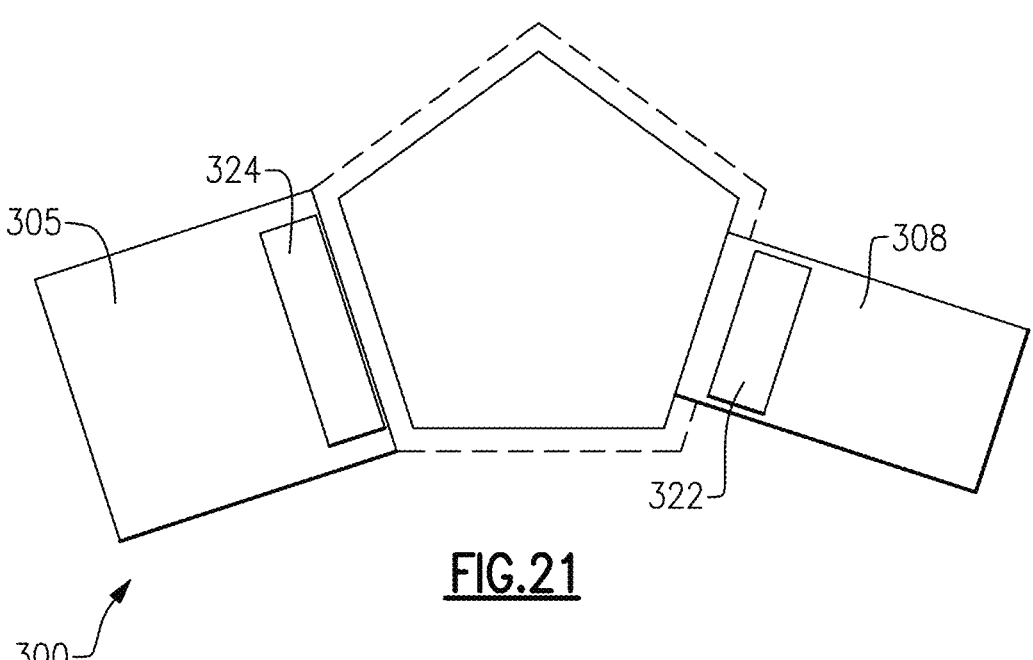
FIG. 21 is a plan view of an example of an acoustic wave device.

The coupling portions 322, 324 can be adjusted to set a temperature threshold for activating the bypass, similar to the discussion of device 200. FIG. 20 shows an example device 300 with relatively small coupling portions 322, 324 that are disposed relatively far apart from each other, which can provide a relatively high temperature threshold for activating the bypass. FIG. 21 shows an example device 300 with relatively large coupling portions 322, 324 that are disposed relatively close together, which can provide a relatively low temperature threshold for activating the bypass. Various different sizes, shapes, positions, orientations, can be used for the coupling portions 322, 324, similar to the discussion relating to device 200.

Figure 22:
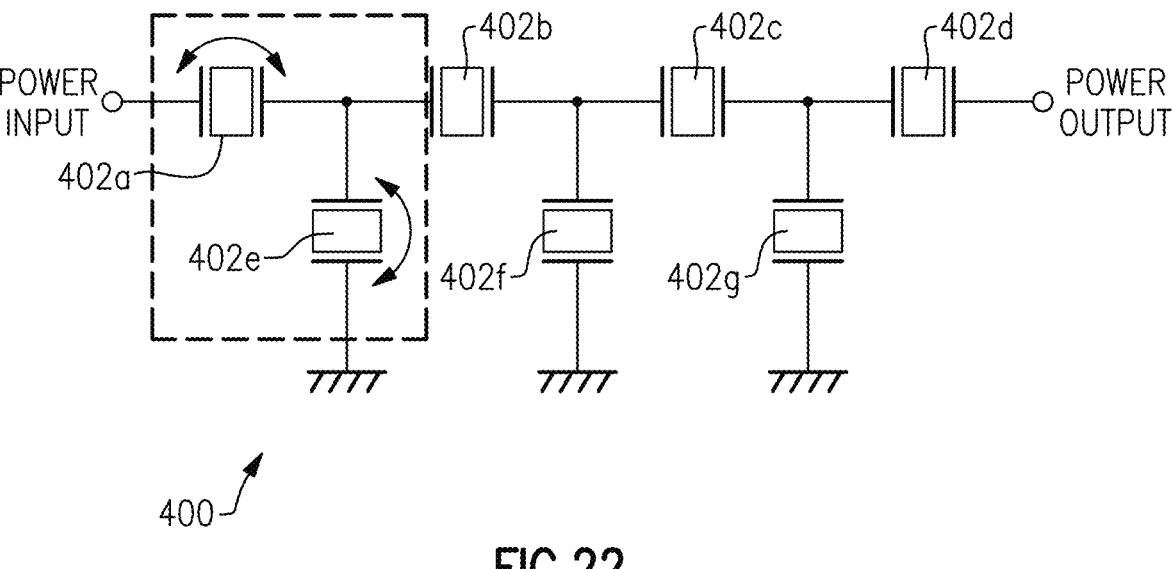
FIG. 22 shows an example of an acoustic ladder filter device.

FIG. 22 shows an example embodiment of an acoustic ladder filter device 400. The filter device 400 can include multiple resonators 402*a-g*, a power input, and a power output. Some or all of the resonators 402*a-g* of the filter device 400 can have shunt or bypass features similar to those described herein. In the event of a stress event (e.g., abnormally high input power or abnormally high ambient temperature), the bypass on one or more of the filters 402 can activate. In the example of FIG. 22, the bypass can be active on the resonators 402*a* and 402*e*, and the bypass can be inactive on the other resonators. In some cases, the bypass can be active on one or more resonators closer to the power input, and the bypass can be inactive on one or more resonators that are further from the power input. Various other types of filter devices can use resonators with the bypass features described herein.

The resonator devices disclosed herein can be implemented in acoustic wave filters. In certain applications, the acoustic wave filters can be band pass filters arranged to pass a radio frequency band and attenuate frequencies outside of the radio frequency band. Two or more acoustic wave filters can be coupled together at a common node and arranged as a multiplexer, such as a duplexer.

Figure 23:
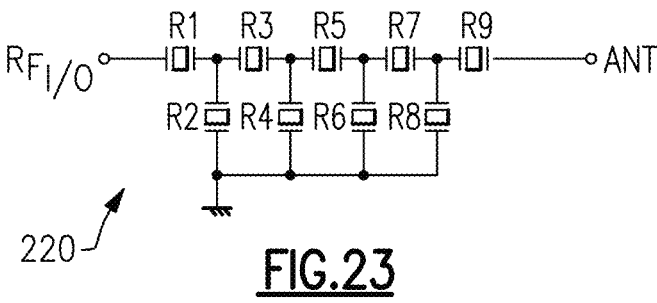
FIG. 23 is a schematic diagram of an example of an acoustic wave ladder filter.

FIG. 23 is a schematic diagram of an example of an acoustic wave ladder filter 220. The acoustic wave ladder filter 220 can be a transmit filter or a receive filter. The acoustic wave ladder filter 220 can be a band pass filter arranged to filter a radio frequency signal. The acoustic wave filter 220 can include series resonators R1, R3, R5, R7, and R9 and shunt resonators R2, R4, R6, and R8 coupled between a radio frequency input/output port RFI/O and an antenna port ANT. The radio frequency input/output port RFI/O can be a transmit port in a transmit filter or a receive port in a receive filter. One or more of the illustrated acoustic wave resonators can be a surface or bulk acoustic wave resonator in accordance with any suitable principles and advantages discussed herein. An acoustic wave ladder filter can include any suitable number of series resonators and any suitable number of shunt resonators.

An acoustic wave filter can be arranged in any other suitable filter topology, such as a lattice topology or a hybrid ladder and lattice topology. A surface or bulk acoustic wave resonator in accordance with any suitable principles and advantages disclosed herein can be implemented in a band pass filter. In some other applications, a surface or bulk acoustic wave resonator in accordance with any suitable principles and advantages disclosed herein can be implemented in a band stop filter.

Figure 24:
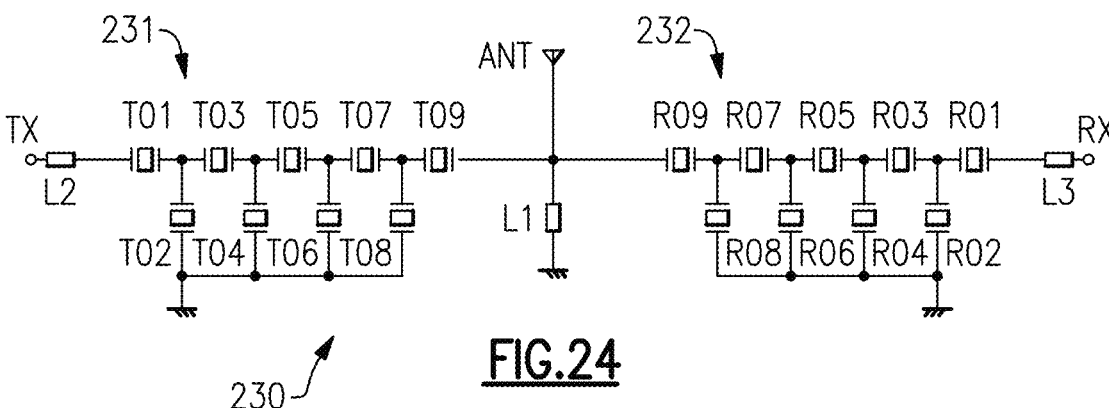
FIG. 24 is a schematic diagram of an example of a duplexer.

FIG. 24 is a schematic diagram of an example of a duplexer 230. The duplexer 230 can include a transmit filter 231 and a receive filter 232 coupled to each other at an antenna node ANT. A shunt inductor L1 can be connected to the antenna node ANT. The transmit filter 231 and the receive filter 232 can both be acoustic wave ladder filters in the duplexer 230.

The transmit filter 131 can filter a radio frequency signal and provide a filtered radio frequency signal to the antenna node ANT. A series inductor L2 can be coupled between a transmit input node TX and the acoustic wave resonators of the transmit filter 131. The illustrated transmit filter 131 can include acoustic wave resonators T01 to T09. One or more of these resonators can be surface or bulk acoustic wave resonator in accordance with any suitable principles and advantages disclosed herein. The illustrated receive filter can include acoustic wave resonators R01 to R09. One or more of these resonators can be a surface or bulk acoustic wave resonator in accordance with any suitable principles and advantages disclosed herein. The receive filter can filter a radio frequency signal received at the antenna node ANT. A series inductor L3 can be coupled between the resonator and a receive output node RX. The receive output node RX of the receive filter provides a radio frequency receive signal.

Figure 25:
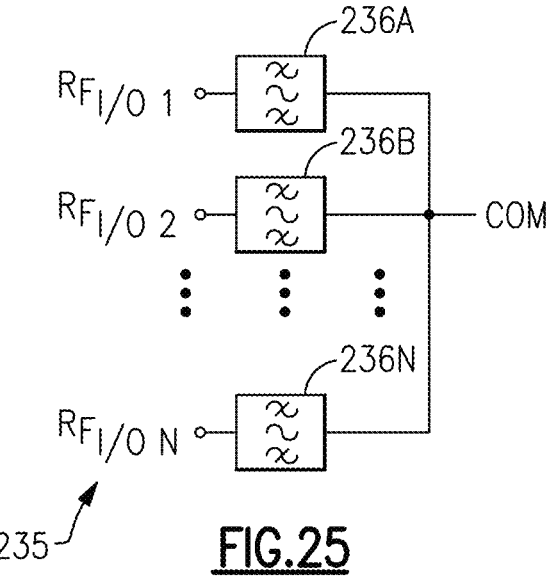
FIG. 25 is a schematic diagram of an example of a multiplexer.

FIG. 25 is a schematic diagram of a multiplexer 235 that includes an acoustic wave filter according to an embodiment. The multiplexer 235 can include a plurality of filters 236A to 236N coupled together at a common node COM. The plurality of filters can include any suitable number of filters including, for example, 3 filters, 4 filters, 5 filters, 6 filters, 7 filters, 8 filters, or more filters. Some or all of the plurality of acoustic wave filters can be acoustic wave filters. Each of the illustrated filters 236A, 236B, and 236N can be coupled between the common node COM and a respective input/output node RFI/O1, RFI/O2, and RFI/ON.

In some instances, all filters of the multiplexer 235 can be receive filters. According to some other instances, all filters of the multiplexer 235 can be transmit filters. In various applications, the multiplexer 235 can include one or more transmit filters and one or more receive filters. Accordingly, the multiplexer 235 can include any suitable number of transmit filters and any suitable number of receive filters. Each of the illustrated filters can be band pass filters having different respective pass bands.

The multiplexer 235 is illustrated with hard multiplexing with the filters 236A to 236N having fixed connections to the common node COM. In some other applications, one or more of the filters of a multiplexer can be electrically connected to the common node by a respective switch. Any of such filters can include a surface or bulk acoustic wave resonator according to any suitable principles and advantages disclosed herein.

A first filter 236A can be an acoustic wave filter having a first pass band and arranged to filter a radio frequency signal. The first filter 236A can include one or more surface or bulk acoustic wave resonators according to any suitable principles and advantages disclosed herein. A second filter 236B has a second pass band. In some embodiments, a raised frame structure of one or more surface or bulk acoustic wave resonators of the first filter 236A can move a raised frame mode of the one or more surface or bulk acoustic wave resonators away from the second passband. This can increase a reflection coefficient (Gamma) of the first filter 236A in the pass band of the second filter 236B. The raised frame structure of the surface or bulk acoustic wave resonator of the first filter 236A can also move the raised frame mode away from the passband of one or more other filters of the multiplexer 235.

In certain instances, the common node COM of the multiplexer 235 can be arranged to receive a carrier aggregation signal including at least a first carrier associated with the first passband of the first filter 236A and a second carrier associated with the second passband of the second filter 236B. A multi-layer raised frame structure of a surface or bulk acoustic wave resonator of the first filter 236A can maintain and/or increase a reflection coefficient of the first filter 236A in the second passband of the second filter 236B that is associated with the second carrier of the carrier aggregation signal.

The filters 236B to 236N of the multiplexer 235 can include one or more acoustic wave filters, one or more acoustic wave filters that include at least one surface or bulk acoustic wave resonator with a raised frame structure, one or more LC filters, one or more hybrid acoustic wave LC filters, or any suitable combination thereof.

The acoustic wave resonators disclosed herein can be implemented in a variety of packaged modules. Some example packaged modules will now be discussed in which any suitable principles and advantages of the surface or bulk acoustic wave devices disclosed herein can be implemented. The example packaged modules can include a package that encloses the illustrated circuit elements. The illustrated circuit elements can be disposed on a common packaging substrate. The packaging substrate can be a laminate substrate, for example. FIGS. 26, 27A, 27B, and 28 are schematic block diagrams of illustrative packaged modules according to certain embodiments. Certain example packaged modules can include one or more radio frequency amplifiers, such as one or more power amplifiers and/or one or more low noise amplifiers. Any suitable combination of features of these modules can be implemented with each other. While duplexers are illustrated in the example packaged modules of FIGS. 26, 27A, and 28, any other suitable multiplexer that includes a plurality of acoustic wave filters coupled to a common node can be implemented instead of one or more duplexers. For example, a quadplexer can be implemented in certain applications. Alternatively or additionally, one or more filters of a packaged module can be arranged as a transmit filter or a receive filter that is not included in a multiplexer.

Figure 26:
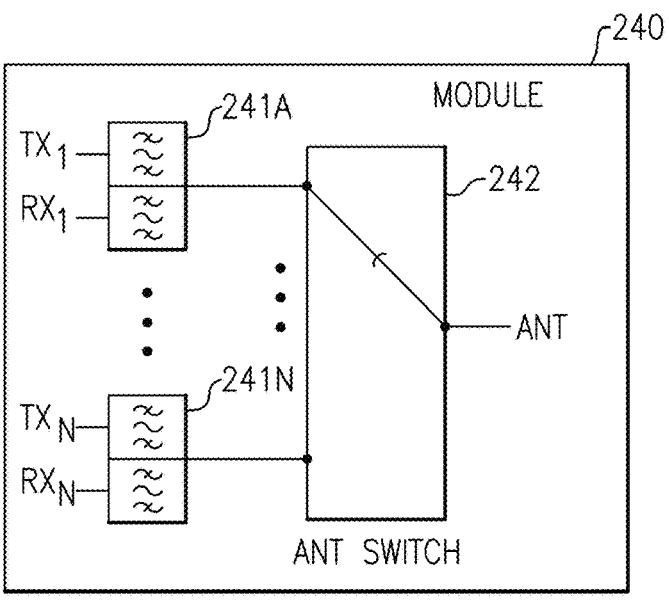
FIG. 26 is a schematic block diagram of a module that includes an antenna switch and duplexers that include one or more raised frame bulk acoustic wave devices.

FIG. 26 is a schematic block diagram of an example module 240 that includes duplexers 241A to 241N and an antenna switch 242. One or more filters of the duplexers 241A to 241N can include any suitable number acoustic wave resonators in accordance with any suitable principles and advantages discussed herein. Any suitable number of duplexers 241A to 241N can be implemented. The antenna switch 242 can have a number of throws corresponding to the number of duplexers 241A to 241N. The antenna switch 242 can electrically couple a selected duplexer to an antenna port of the module 240.

FIG. 27A is a schematic block diagram of an example module 250 that includes a power amplifier 252, a radio frequency switch 254, and duplexers 241A to 241N in accordance with one or more embodiments. The power amplifier 252 can amplify a radio frequency signal. The radio frequency switch 254 can be a multi-throw radio frequency switch. The radio frequency switch 254 can electrically couple an output of the power amplifier 252 to a selected transmit filter of the duplexers 241A to 241N. One or more filters of the duplexers 241A to 241N can include any suitable number of surface or bulk acoustic wave resonators in accordance with any suitable principles and advantages discussed herein. Any suitable number of duplexers 241A to 241N can be implemented.

FIG. 27B is a schematic block diagram of an example module 255 that includes filters 256A to 256N, a radio frequency switch 257, and a low noise amplifier 258 according to one or more embodiments. One or more filters of the filters 256A to 256N can include any suitable number of surface or bulk acoustic wave resonators in accordance with any suitable principles and advantages disclosed herein. Any suitable number of filters 256A to 256N can be implemented. The illustrated filters 256A to 256N can be receive filters. In some embodiments (not illustrated), one or more of the filters 256A to 256N can be included in a multiplexer that also includes a transmit filter. The radio frequency switch 257 can be a multi-throw radio frequency switch. The radio frequency switch 257 can electrically couple an output of a selected filter of filters 256A to 256N to the low noise amplifier 257. In some embodiments (not illustrated), a plurality of low noise amplifiers can be implemented. The module 255 can include diversity receive features in certain applications.

Figure 28:
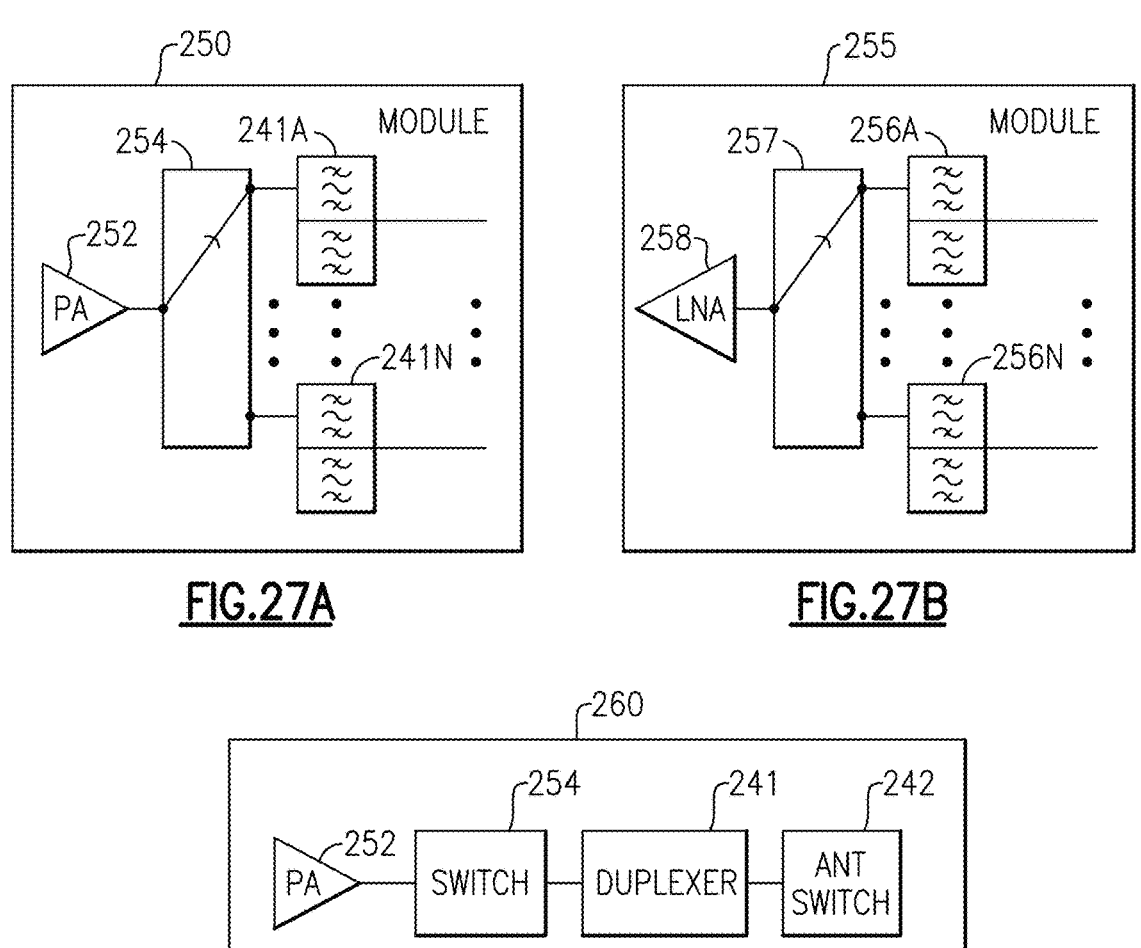
FIG. 28 is a schematic block diagram of a module that includes a power amplifier, a radio frequency switch, a duplexer that includes one or more raised frame bulk acoustic wave devices.

FIG. 28 is a schematic block diagram of an example module 260 that includes a power amplifier 252, a radio frequency switch 254, and a duplexer 241 that includes surface or bulk acoustic wave device in accordance with one or more embodiments, and an antenna switch 242. The module 260 can include elements of the module 240 and elements of the module 250.

Figure 29A:
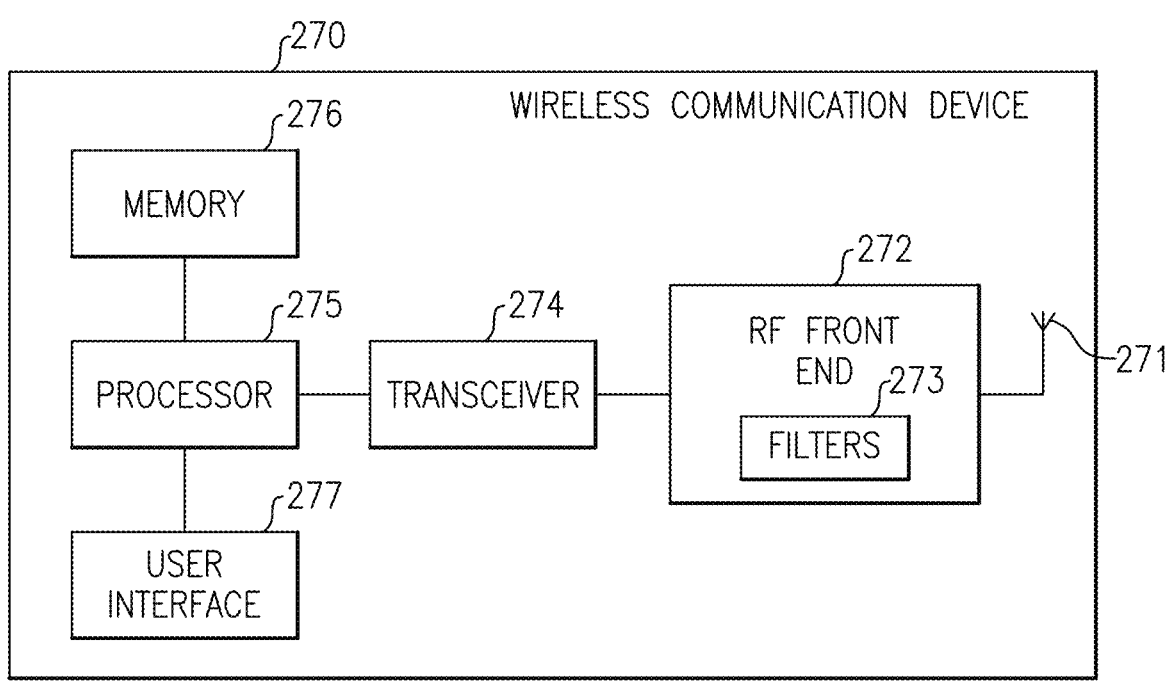
FIG. 29A is a schematic block diagram of a wireless communication device that includes filters that include one or more raised frame bulk acoustic wave devices.

One or more filters with any suitable number of surface or bulk acoustic devices can be implemented in a variety of wireless communication devices. FIG. 29A is a schematic block diagram of an example wireless communication device 270 that includes a filter 273 with one or more acoustic wave resonators in accordance with any suitable principles and advantages disclosed herein. The wireless communication device 270 can be any suitable wireless communication device. For instance, a wireless communication device 270 can be a mobile phone, such as a smart phone. As illustrated, the wireless communication device 270 includes an antenna 271, a radio frequency (RF) front end 272 that includes filter 273, an RF transceiver 274, a processor 275, a memory 276, and a user interface 277. The antenna 271 can transmit RF signals provided by the RF front end 272. The antenna 271 can provide received RF signals to the RF front end 272 for processing.

The RF front end 272 can include one or more power amplifiers, one or more low noise amplifiers, RF switches, receive filters, transmit filters, duplex filters, filters of a multiplexer, filters of a diplexers or other frequency multiplexing circuit, or any suitable combination thereof. The RF front end 272 can transmit and receive RF signals associated with any suitable communication standards. Any of the acoustic wave resonators disclosed herein can be implemented in filters 273 of the RF front end 272.

The RF transceiver 274 can provide RF signals to the RF front end 272 for amplification and/or other processing. The RF transceiver 274 can also process an RF signal provided by a low noise amplifier of the RF front end 272. The RF transceiver 274 is in communication with the processor 275. The processor 275 can be a baseband processor. The processor 275 can provide any suitable base band processing functions for the wireless communication device 270. The memory 276 can be accessed by the processor 275. The memory 276 can store any suitable data for the wireless communication device 270. The processor 275 is also in communication with the user interface 277. The user interface 277 can be any suitable user interface, such as a display.

Figure 29B:
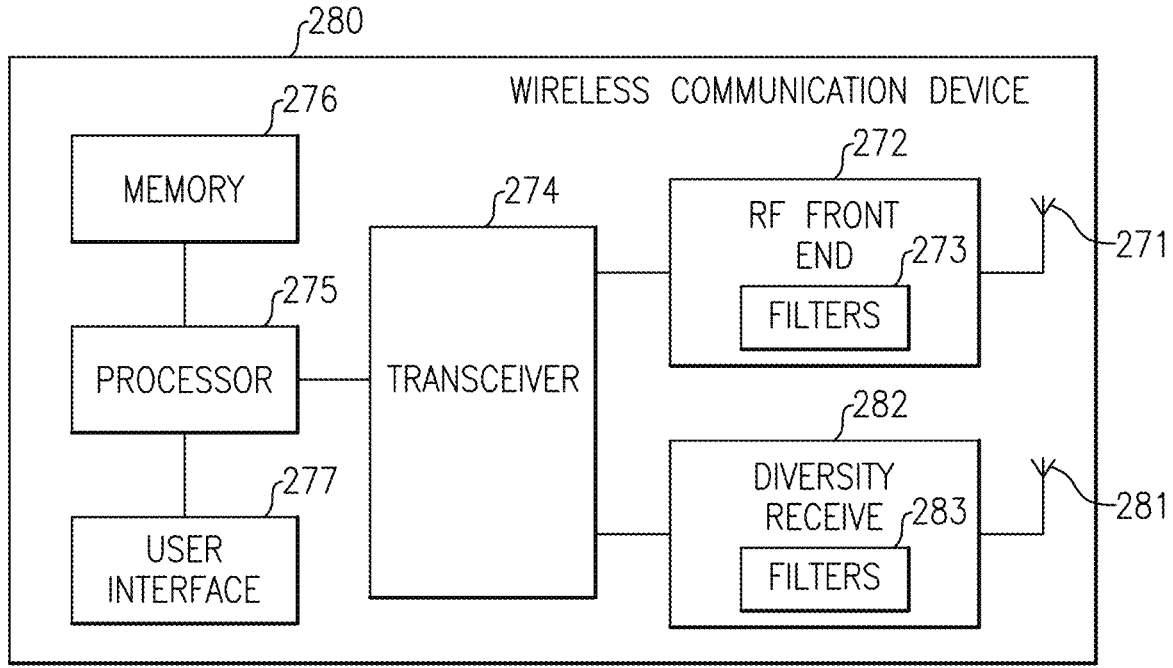
FIG. 29B is a schematic block diagram of another wireless communication device that includes filters that include one or more raised frame bulk acoustic wave devices.

FIG. 29B is a schematic diagram of a wireless communication device 280 that includes filters 273 in a radio frequency front end 272 and second filters 283 in a diversity receive module 282. The wireless communication device 280 is like the wireless communication device 270 of FIG. 29A, except that the wireless communication device 280 also includes diversity receive features. As illustrated in FIG. 29B, the wireless communication device 280 can include a diversity antenna 281, a diversity module 282 configured to process signals received by the diversity antenna 281 and including filters 283, and a transceiver 274 in communication with both the radio frequency front end 272 and the diversity receive module 282. One or more of the second filters 283 can include a surface or bulk acoustic wave resonator in accordance with any suitable principles and advantages disclosed herein.

Acoustic wave devices disclosed herein can be included in a filter and/or a multiplexer arranged to filter a radio frequency signal in a fifth generation (5G) New Radio (NR) operating band within Frequency Range 1 (FR1). FR1 can be from 410 megahertz (MHz) to 7.125 gigahertz (GHz), for example, as specified in a current 5G NR specification. A filter arranged to filter a radio frequency signal in a 5G NR FR1 operating band can include one or more acoustic wave resonators be implemented in accordance with any suitable principles and advantages disclosed herein.

5G NR carrier aggregation specifications can present technical challenges. For example, 5G carrier aggregations can have wider bandwidth and/or channel spacing than fourth generation (4G) Long Term Evolution (LTE) carrier aggregations. Carrier aggregation bandwidth in certain 5G FR1 applications can be in a range from 120 MHz to 400 MHz, such as in a range from 120 MHz to 200 MHz. Carrier spacing in certain 5G FR1 applications can be up to 100 MHz. Acoustic wave resonators as disclosed herein can have improved heat management, in some embodiments.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 8.5 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

While certain embodiments have been described, these embodiments have been presented by way of example only, and are not intended to limit the scope of the disclosure. Indeed, the novel resonators, devices, modules, apparatus, methods, and systems described herein may be embodied in a variety of other forms. Furthermore, various omissions, substitutions and changes in the form of the resonators, devices, modules, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. An acoustic wave device comprising:
a substrate that decreases in electrical resistivity in response to an increase in temperature;
a piezoelectric layer over the substrate; and
an interdigital transducer electrode over the piezoelectric layer, the interdigital transducer electrode including a first bus bar, a second bus bar and a plurality of fingers that transfer electrical current from the first bus bar to the second bus bar via a first pathway, the interdigital transducer electrode including a plurality of coupling portions with at least a first coupling portion coupled to the first bus bar and at least a second coupling portion connected to the second bus bar, the first and second coupling portions extend through at least part of the piezoelectric layer towards the substrate to electrically couple first and second bus bars with the substrate and transfer electrical current from the first bus bar to the second bus bar via a second pathway through the substrate to bypass the first pathway based at least in part on the temperature of the substrate.

2. The device of claim 1, wherein the substrate is made of a semiconductor material.

3. The device of claim 1, wherein the substrate is made of silicon.

4. The device of claim 1, wherein one or more of the plurality of coupling portions extend completely through the piezoelectric layer.

5. The device of claim 1, wherein one or more of the plurality of coupling portions are in direct contact with the substrate.

6. The device of claim 1, wherein one or more of the plurality of coupling portions are in ohmic contact with the substrate.

7. The device of claim 1, wherein one or more of the plurality of coupling portions are capacitively coupled to the substrate.

8. The device of claim 7, wherein a dielectric material is disposed between the one or more of the plurality of coupling portions and the substrate.

9. The device of claim 1, further comprising a dielectric layer between the piezoelectric layer and the substrate.

10. The device of claim 9, wherein one or more of the plurality of coupling portions extend at least partially through the dielectric layer.

11. The device of claim 9, wherein one or more of the plurality of coupling portions extend completely through the dielectric layer.

12. The device of claim 1, wherein the plurality of coupling portions are configured to provide a bypass current pathway through the substrate.

13. The device of claim 1, wherein the interdigital transducer electrode includes a first bus bar with a first coupling portion that electrically couples the first bus bar to the substrate and a second bus bar with a second coupling portion that electrical couples the second bus bar to the substrate.

14. An acoustic wave device comprising:
a substrate that decreases in electrical resistivity in response to an increase in temperature;
a piezoelectric layer over the substrate; and
an interdigital transducer electrode, the piezoelectric layer disposed between the substrate and the interdigital transducer electrode, the interdigital transducer electrode including a first bus bar, second bus bar, a first plurality of fingers extending from the first bus bar toward the second bus bar, a second plurality of fingers extending towards the first bus bar, a first coupling portion on the first bus bar that extends through at least part of the piezoelectric layer towards the substrate to electrically couple the first bus bar to the substrate, and a second coupling portion on the second bus bar that extends through at least part of the piezoelectric layer towards the substrate to electrically couple the second bus bar to the substrate, the first and second coupling portions transfer electrical current from the first bus bar to the second bus bar through the substrate below the piezoelectric layer based at least in part on the temperature of the substrate.

15. The device of claim 14, wherein the substrate is made of a semiconductor material.

16. The device of claim 14, wherein the first and second coupling portions extend completely through the piezoelectric layer.

17. The device of claim 14, wherein the first and second coupling portions are in direct contact with the substrate.

18. The device of claim 14, wherein the first and second coupling portions are in ohmic contact with the substrate.

19. The device of claim 14, wherein the first and second coupling portions are capacitively coupled to the substrate.

20. The device of claim 14, further comprising a dielectric layer between the piezoelectric layer and the substrate.

21. The device of claim 20, wherein the first and second coupling portions extend at least partially through the dielectric layer.

22. The device of claim 20, wherein the first and second coupling portions extend completely through the dielectric layer.

23. The device of claim 14, wherein the first and second coupling portions are configured to provide a bypass current pathway through the substrate.

24. The device of claim 14, wherein the device is a surface acoustic wave device.

25. The device of claim 14, wherein the device is a multi-layer piezoelectric substrate device.

26. A method of operating an acoustic wave device, the method comprising:

transferring electrical current from a first bus bar to a second bus bar via a first pathway through interdigitated fingers of an interdigital transducer electrode on a piezoelectric layer that is disposed between a substrate and the interdigital transducer electrode, the substrate decreasing in electrical resistivity in response to increasing temperature;

transferring electrical current from the first bus bar to the second bus bar via a second pathway through the substrate, the second pathway including a first coupling portion that extends from the first bus bar through the piezoelectric layer towards the substrate to electrically couple with the substrate, and the second pathway further including a second coupling portion that extends from the second bus bar through the piezoelectric layer towards the substrate to electrically couple with the substrate; and bypassing the first pathway with the second pathway based at least in part on temperature of the substrate.

\*    \*    \*    \*    \*